(12) United States Patent
Nishiyama

(10) Patent No.: US 10,586,755 B2
(45) Date of Patent: Mar. 10, 2020

(54) SEMICONDUCTOR DEVICE, AND METHOD FOR MANUFACTURING SEMICONDUCTOR DEVICE

(71) Applicant: Rohm Co., Ltd., Kyoto-shi, Kyoto (JP)

(72) Inventor: Yuto Nishiyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/238,107

(22) Filed: Jan. 2, 2019

(65) Prior Publication Data

US 2019/0221504 A1 Jul. 18, 2019

(30) Foreign Application Priority Data

Jan. 15, 2018 (JP) .................................. 2018-004022
Mar. 12, 2018 (JP) .................................. 2018-044059

(51) Int. Cl.
*H01L 23/495* (2006.01)
*H01L 23/00* (2006.01)
*H01L 21/48* (2006.01)

(52) U.S. Cl.
CPC .... *H01L 23/49555* (2013.01); *H01L 21/4842* (2013.01); *H01L 23/4952* (2013.01); *H01L 23/49548* (2013.01); *H01L 23/49562* (2013.01); *H01L 23/49575* (2013.01); *H01L 23/49582* (2013.01); *H01L 24/49* (2013.01); *H01L 24/45* (2013.01); *H01L 2224/04042* (2013.01); *H01L 2224/0603* (2013.01); *H01L 2224/45124* (2013.01); *H01L 2224/45144* (2013.01); *H01L 2224/48137* (2013.01); *H01L 2224/48247* (2013.01); *H01L 2224/48257* (2013.01); *H01L 2224/4903* (2013.01); *H01L 2224/49171* (2013.01); *H01L 2224/49505* (2013.01)

(58) Field of Classification Search
USPC ......... 257/41, 81, 82, 91, 99, 177–182, 276, 257/457, 459, 502, 503, 573, 584, 602, 257/621, 664–677, 688–700, 734–786, 257/E23.01–E23.079, E23.141–E23.179; 438/83, 98, 100, 101, 111, 112, 123, 124, 438/411, 412, 461, 584, 597–688
See application file for complete search history.

(56) References Cited

U.S. PATENT DOCUMENTS

| | | | |
|---|---|---|---|
| 2001/0005039 A1* | 6/2001 | Russell | ............... H01L 23/4951 257/666 |
| 2009/0230518 A1* | 9/2009 | Liu | ................... H01L 23/49524 257/666 |
| 2018/0040540 A1* | 2/2018 | Kasuya | ..................... H02P 6/14 |

FOREIGN PATENT DOCUMENTS

JP 2015-92609 A 5/2015

* cited by examiner

*Primary Examiner* — Niki H Nguyen
(74) *Attorney, Agent, or Firm* — Hamre, Schumann, Mueller & Larson, P.C.

(57) ABSTRACT

A semiconductor device includes a first lead with a first block, a second lead with a second block, and a sealing resin partially covering the first and second leads. The first block is exposed from the sealing resin and has a first covered surface covered with an electroconductive layer, and a pair of first exposed surfaces spaced apart from each other via a part of the first covered surface. The second block is exposed from the sealing resin and has a second covered surface covered with an electroconductive layer, and a pair of second exposed surfaces spaced apart from each other via a part of the first covered surface.

20 Claims, 26 Drawing Sheets

SEMICONDUCTOR DEVICE, AND METHOD FOR MANUFACTURING SEMICONDUCTOR DEVICE

FIELD

The present disclosure relates to a semiconductor device in which switching elements, such as MOSFETs, are mounted on leads that are separated from each other, and also relates to a method for manufacturing a semiconductor device.

BACKGROUND

A semiconductor device including switching elements, such as MOSFETs, and converting power based on an input electric signal is widely known. JP-A-2015-92609 discloses an example of a semiconductor device including MOSFETs, and these MOSFETs are mounted on chip mounts that are separated from each other (see FIGS. 18 and 19 in JP-A-2015-92609).

In the semiconductor device disclosed in JP-A-2015-92609, the chip mounts partially protrude from a sealing resin as viewed in a thickness direction so as to promptly dissipate heat generated from the MOSFETs when the semiconductor device is in use. In the case of manufacturing a semiconductor device having an improved heat dissipation property based on such a configuration, when a sealing resin is formed, relatively large resin burrs are generated due to a synthetic resin leaked from between two chip mounts. This poses a problem because it takes time and effort to remove resin burrs during the manufacturing of such a semiconductor device.

SUMMARY

In view of the circumstances described above, an object of the present disclosure is to provide a semiconductor device capable of reducing the size of resin burrs generated during manufacturing, and a method for manufacturing the semiconductor device.

According to a first aspect of the disclosure, there is provided a semiconductor device including: a first lead including a first pad portion and a first block portion, where the first pad portion has a first obverse surface facing in a thickness direction, and the first block portion is shifted in position from the first pad portion in a first direction perpendicular to the thickness direction; a second lead including a second pad portion and a second block portion, where the second pad portion has a second obverse surface facing in the thickness direction, and the second block portion is shifted in position from the second pad portion in the first direction, and the second lead is spaced apart from the first lead in a second direction perpendicular to the thickness direction and the first direction; a first switching element electrically bonded to the first obverse surface and electrically connected to the first lead; a second switching element electrically bonded to the second obverse surface; and a sealing resin covering a part of the first lead, a part of the second lead, the first switching element and the second switching element. The first block portion protrudes from the sealing resin in the first direction, and has a first covered surface and a pair of first exposed surfaces, where the first covered surface is covered with an outer conductive layer, and the pair of first exposed surfaces are spaced apart from each other in the second direction via a first area of the first covered surface. The second block portion protrudes from the sealing resin in the first direction, and has a second covered surface and a pair of second exposed surfaces, where the second covered surface is covered with an outer conductive layer, and the pair of second exposed surfaces is spaced apart from each other in the second direction via with an area of the second covered surface.

According to a second aspect of the disclosure, there is provided a method for manufacturing a semiconductor device by using a lead frame including: an outer frame portion; a first tie bar protruding from a part of the outer frame portion in a first direction perpendicular to a thickness direction of the outer frame portion; a first lead; and a second lead, where the first tie bar includes a first connection band, a second connection band, and an intermediate connection band, and the first connection band and the second connection band are spaced apart from each other in a second direction perpendicular to the thickness direction and the first direction, and the intermediate connection band is disposed between the first connection band and the second connection band. The first lead has an end in the first direction that is connected to the first connection band, and the second lead has an end in the first direction that is connected to the second connection band. The method includes: electrically bonding a first switching element and a second switching element to the first lead and the second lead, respectively; forming a sealing resin to cover a part of the first lead, a part of the second lead, the first switching element and the second switching element; removing the intermediate connection band; forming an outer conductive layer to cover a surface of the lead frame that is exposed from the sealing resin; and cutting the first connection band and the second connection band along a cutting line. The first connection band is formed with a first through-hole extending in the thickness direction, and the second connection band is formed with a second through-hole extending in the thickness direction. The cutting line passes, as viewed in the thickness direction, through the first through-hole, a pair of areas of the first connection band sandwiching the first through-hole in the second direction, the second through-hole, and a pair of areas of the second connection band sandwiching the second through-hole in the second direction.

The semiconductor device and the method for manufacturing the semiconductor device according to the present disclosure can reduce the size of resin burrs generated during the manufacturing of the semiconductor device, and can also improve heat dissipation property.

Other features and advantages of the present disclosure will become apparent from the following detailed description with reference to the accompanying drawings.

DRAWINGS

DETAILED DESCRIPTION

The following describes embodiments for implementing the present disclosure with reference to the attached drawings.

Figure 1:
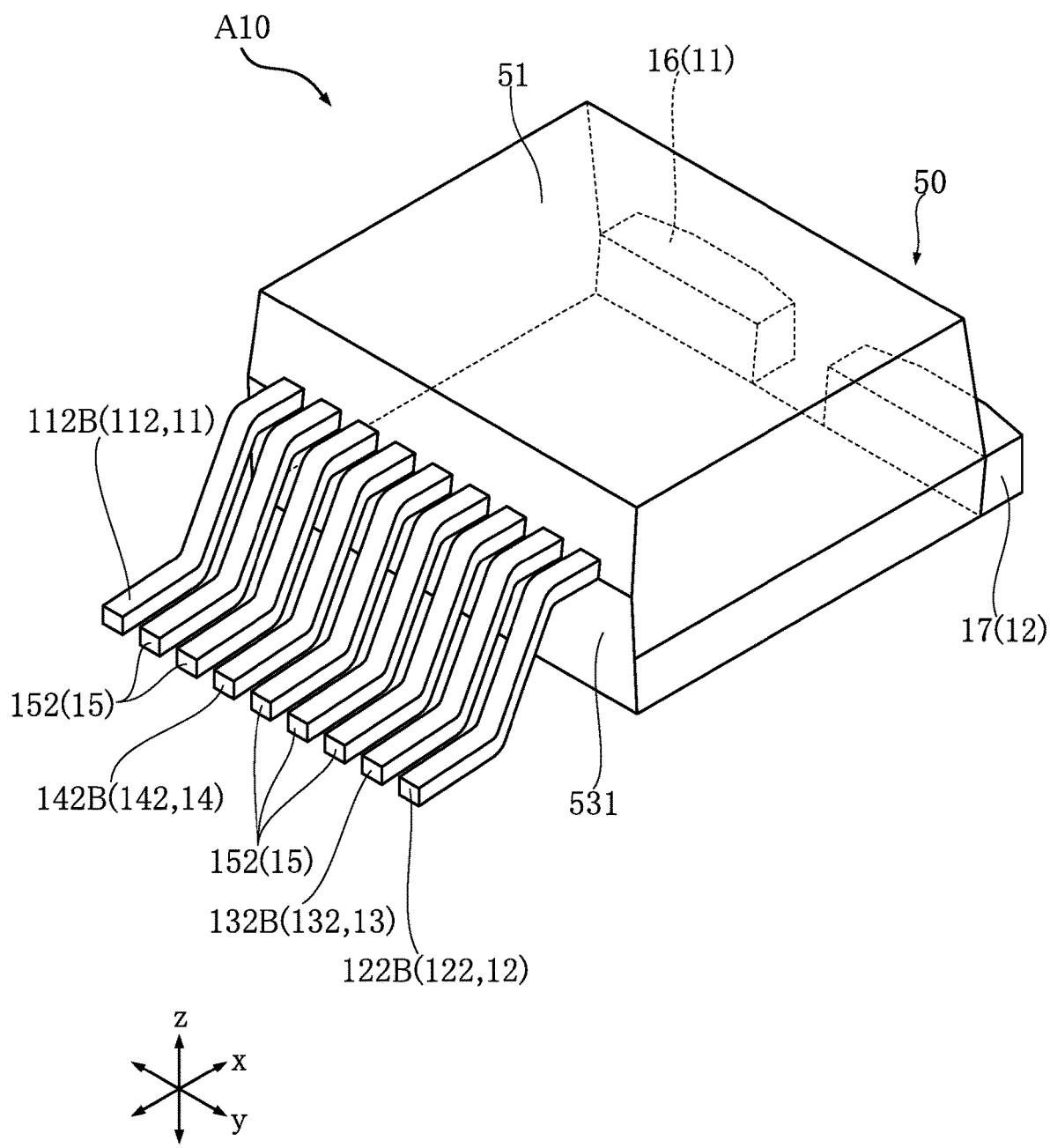
FIG. 1 is a perspective view showing a semiconductor device according to a first embodiment of the present disclosure.
Figure 2:
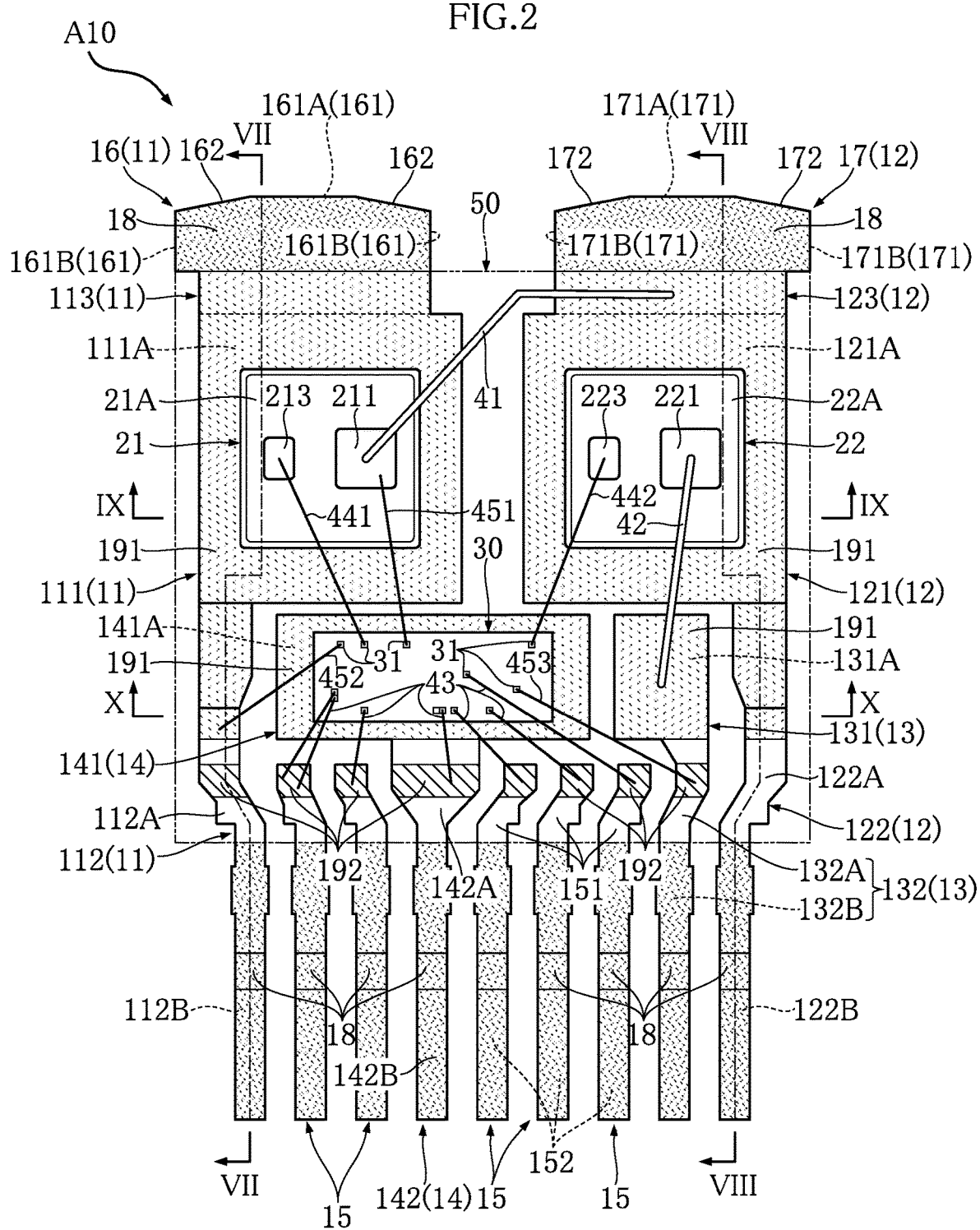
FIG. 2 is a plan view showing the semiconductor device of FIG. 1 (a sealing resin is shown transparent)
Figure 5:
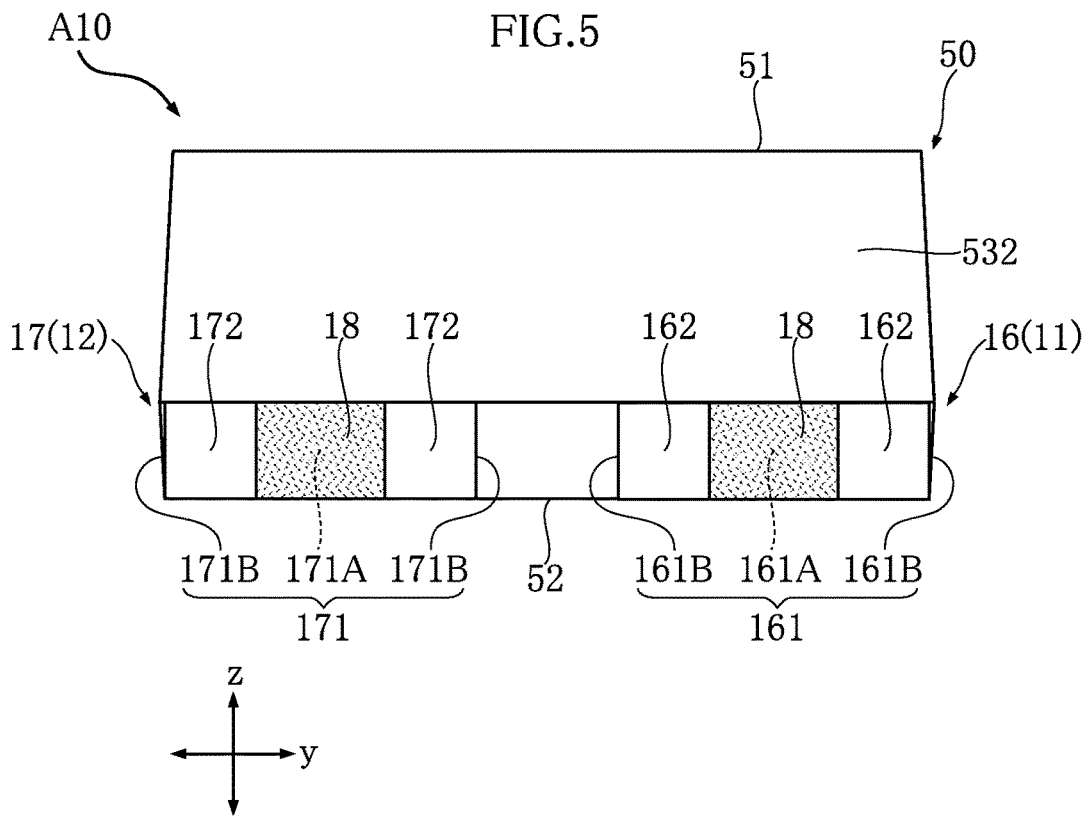
FIG. 5 is a rear view showing the semiconductor device of FIG. 1.
Figure 6:
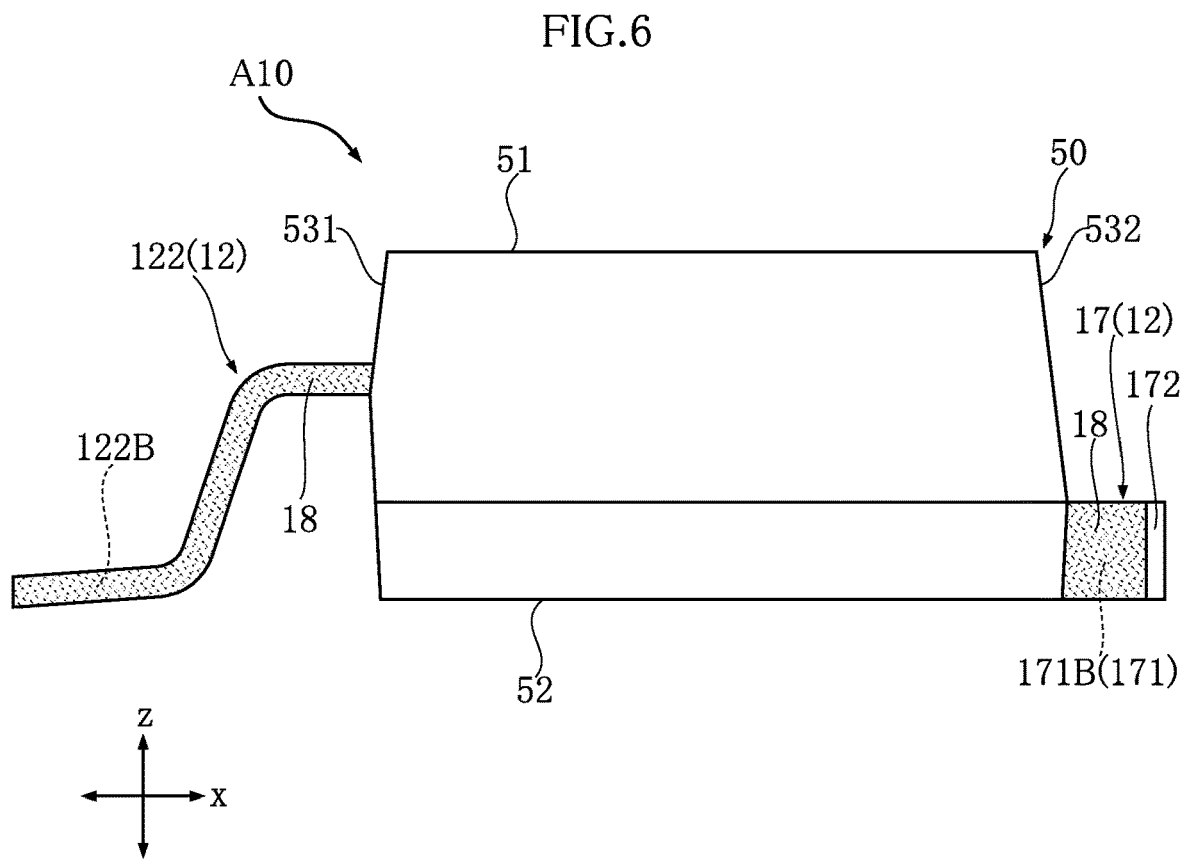
FIG. 6 is a right-side view showing the semiconductor device of FIG. 1.
Figure 7:
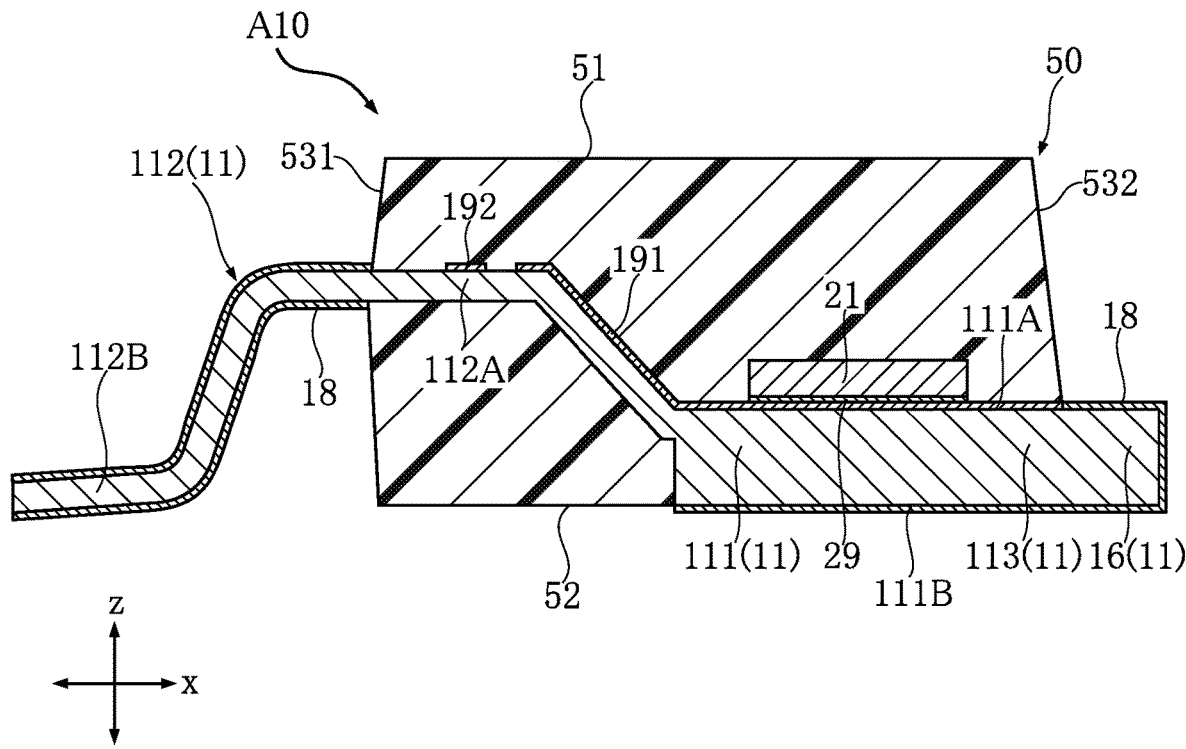
FIG. 7 is a cross-sectional view taken along line VII-VII in FIG. 2.
Figure 8:
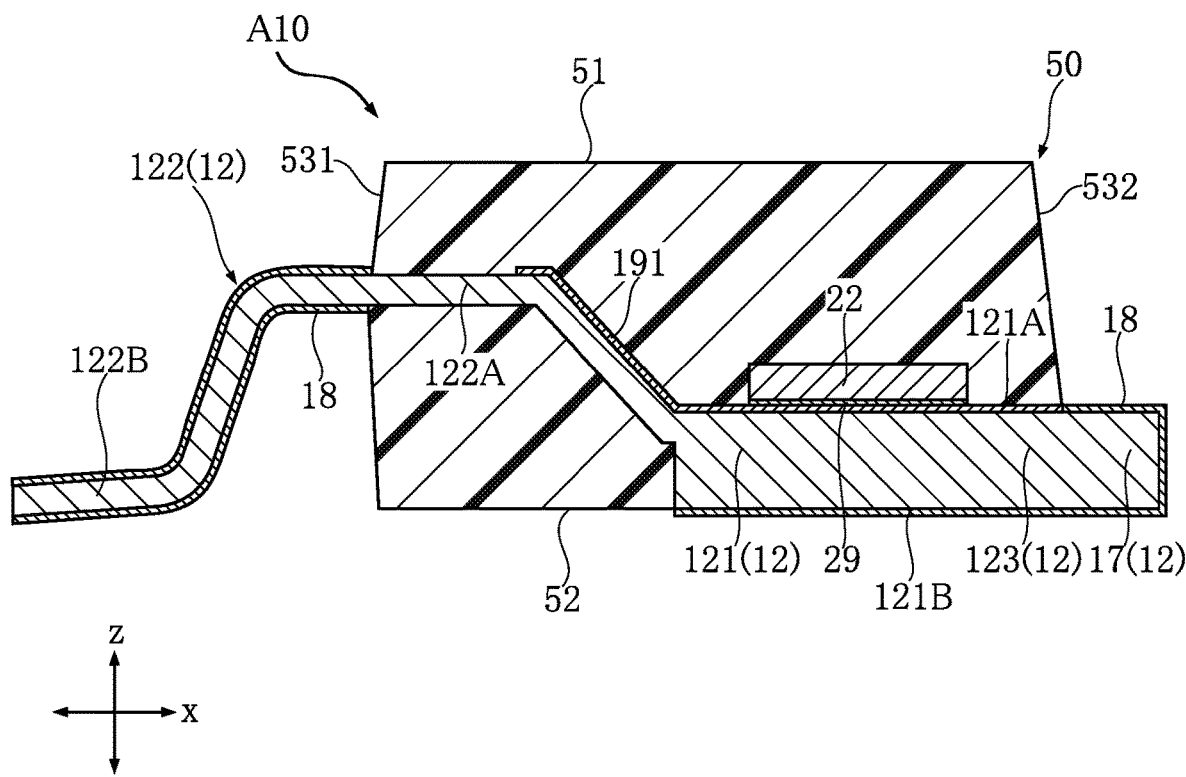
FIG. 8 is a cross-sectional view taken along line VIII-VIII in FIG. 2.

With reference to FIGS. 1 to 12, a semiconductor device A10 according to a first embodiment of the present disclosure is described. The semiconductor device A10 includes a first lead 11, a second lead 12, a third lead 13, a fourth lead 14, a plurality of fifth leads 15, a first switching element 21, a second switching element 22, a drive IC 30, a first wire 41, a second wire 42, and a sealing resin 50. In FIG. 2, the sealing resin 50 is shown transparent for ease of understanding. In FIG. 2, the sealing resin 50 is indicated by imaginary lines (two-dot chain lines). FIGS. 7 and 8 are cross-sectional views, each of which is taken along a one-dot chain line shown in FIG. 2. In FIGS. 2 to 6, areas covered by an outer conductive layer 18, a first inner conductive layer 191, and a second inner conductive layer 192 are hatched for ease of understanding.

In the description of the semiconductor device A10, the thickness direction of the first lead 11 and the second lead 12 is referred to as "thickness direction z" for convenience. The direction that is perpendicular to the thickness direction z and in which the first lead 11 and the second lead 12 partially protrude from the sealing resin 50 as viewed in the thickness direction z is referred to as "first direction x". The direction that is perpendicular to both the thickness direction z and the first direction x and in which the first lead 11 and the second lead 12 are separated from each other is referred to as "second direction y". "Viewed in the thickness direction z" indicates the plan view of the semiconductor device A10. Note that the terms "thickness direction z", "first direction x" and "second direction y" are also used in the descriptions below on a semiconductor device A11 and a method for manufacturing the semiconductor device A10.

The semiconductor device A10 shown in FIG. 1 converts DC power input from outside to AC power with the first switching element 21 and the second switching element 22. The semiconductor device A10 is used in a motor driver for driving and controlling an AC motor, a switching regulator, or the like.

The first lead 11, the second lead 12, the third lead 13, the fourth lead 14, and the plurality of fifth leads 15 are conductive members that form a conductive path between the first and second switching elements 21, 22 and a wiring board on which the semiconductor device A10 is mounted. The first lead 11, the second lead 12, the third lead 13, the fourth lead 14, and the plurality of fifth leads 15 are all formed with a single lead frame 80 (details are described below). The lead frame 80 is made of copper (Cu) or a copper alloy.

As shown in FIG. 2, the first switching element 21 is mounted on the first lead 11. The first lead 11 has a first pad portion 111, a first terminal portion 112, a first connecting portion 113, and a first block portion 16.

Figure 9:
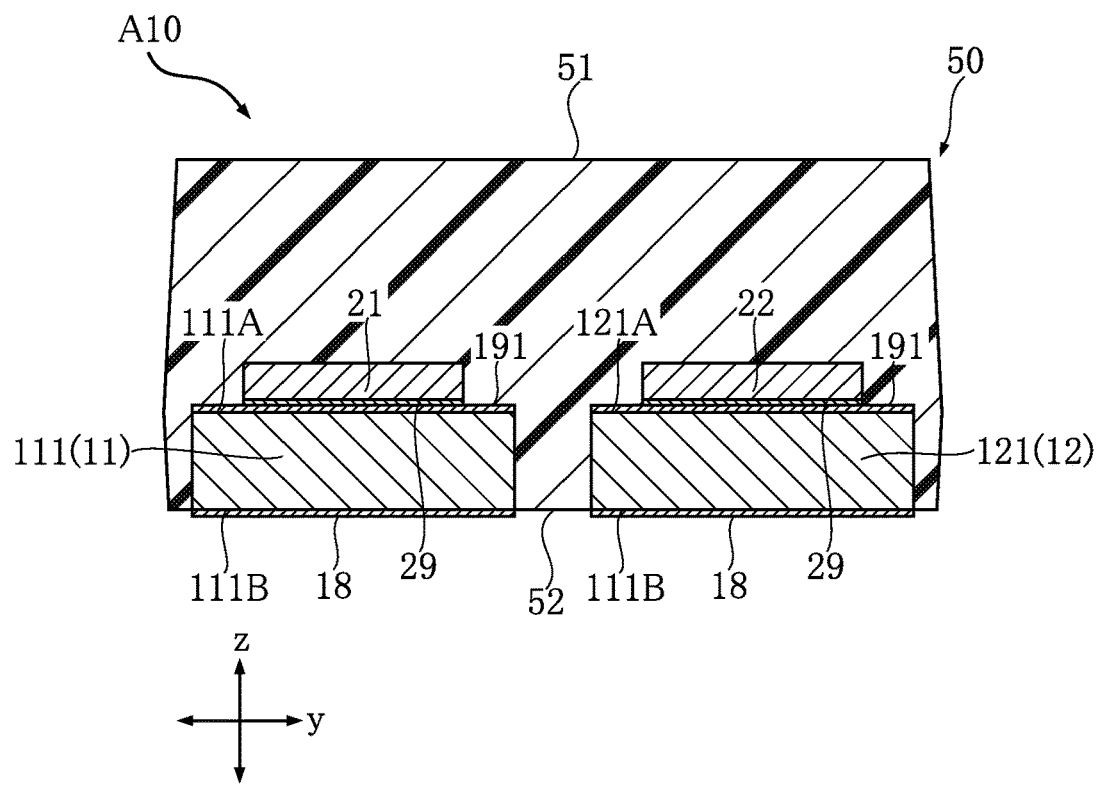
FIG. 9 is a cross-sectional view taken along line IX-IX in FIG. 2.

As shown in FIGS. 2, 7, and 9, the first switching element 21 is mounted on the first pad portion 111. The first pad portion 111 is rectangular as viewed in the thickness direction z. The first pad portion 111 has a first obverse surface 111A and a first reverse surface 111B. The first obverse surface 111A faces the first switching element 21 in the thickness direction z. The first reverse surface 111B faces away from the first obverse surface 111A in the thickness direction z. The first pad portion 111 is covered with the sealing resin 50, except for the first reverse surface 111B.

Figure 3:
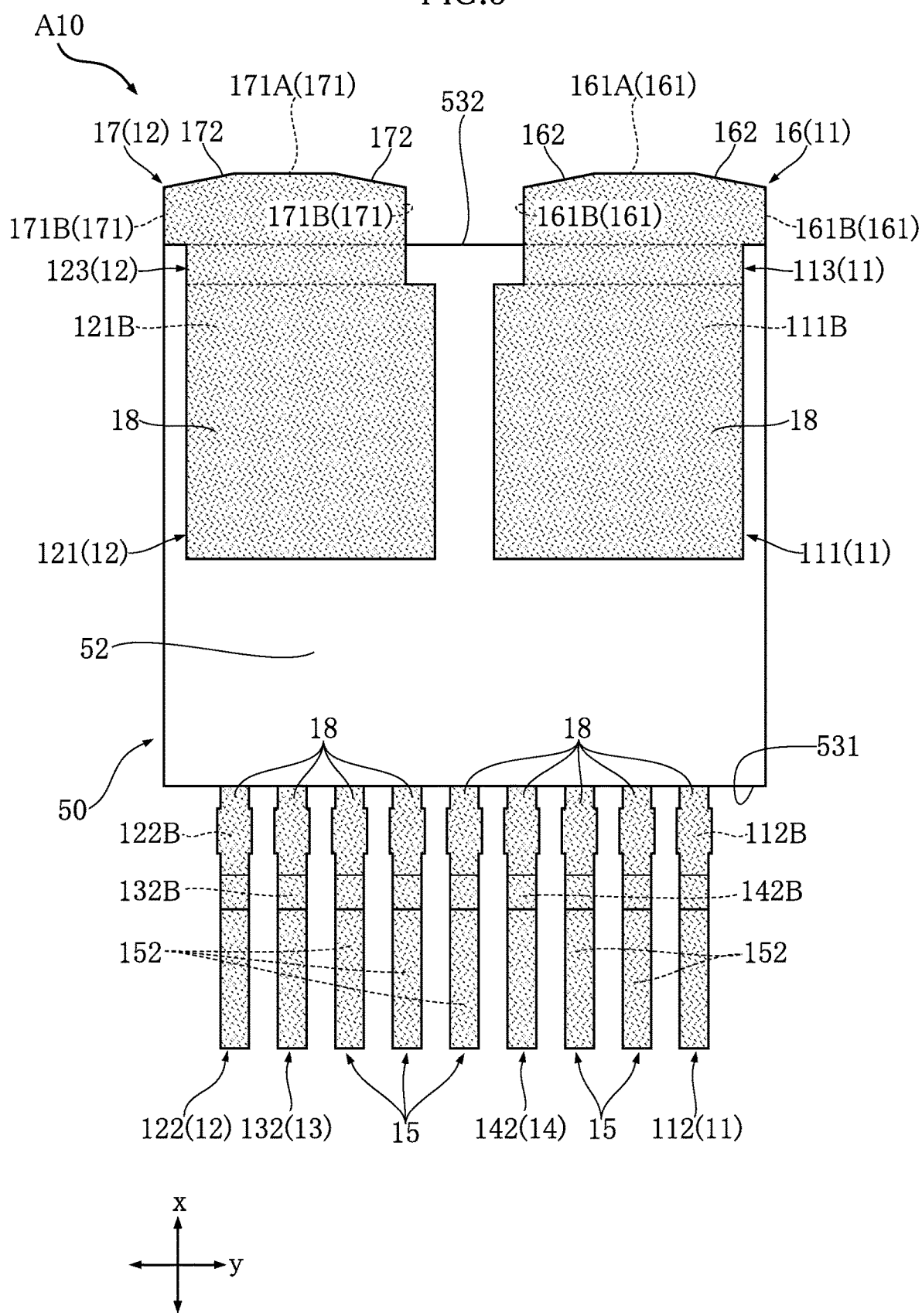
FIG. 3 is a bottom view showing the semiconductor device of FIG. 1.

As shown in FIGS. 2 and 7, the first obverse surface 111A is covered with the first inner conductive layer 191 which is made of metal. The first inner conductive layer 191 is a plating layer of a metal, such as nickel (Ni), that is more resistant to thermal shock than the second inner conductive layer 192 (details are described later). As shown in FIGS. 3 and 7, the first reverse surface 111B is covered with the outer conductive layer 18 that is made of metal. The outer conductive layer 18 is a plating layer of a metal, such as tin (Sn) or a tin-silver (Ag) alloy, that has a relatively low melting point.

As shown in FIG. 2, the first terminal portion 112 is located opposite from the first block portion 16 with respect to the first pad portion 111 in the first direction x. The first terminal portion 112 is a positive electrode terminal (P terminal) for inputting DC power, which is to be converted by the first switching element 21 and the second switching element 22. The first terminal portion 112 has a strip-like shape extending from the first pad portion 111 in the first direction x as viewed in the thickness direction z. The first terminal portion 112 has a first covered portion 112A and a first exposed portion 112B.

As shown in FIGS. 2 and 7, the first covered portion 112A is covered with the sealing resin 50. One end of the first covered portion 112A in the first direction x is connected to the first pad portion 111, and is inclined to both the first direction x and the thickness direction z. In the semiconductor device A10, the first covered portion 112A has an area facing the same side as the first obverse surface 111A of the first pad portion 111 in the thickness direction z, and the area has a portion covered with the first inner conductive layer 191, and a portion covered with the second inner conductive layer 192 made of metal. The second inner conductive layer 192 is a silver plating layer, for example.

As shown in FIGS. 2 and 7, the first exposed portion 112B protrudes from the sealing resin 50 in the first direction x as viewed in the thickness direction z. The first exposed portion 112B is bent in a hook shape as viewed in the second direction y, and is covered with the outer conductive layer 18.

As shown in FIGS. 2 and 7, the first connecting portion 113 connects the first pad portion 111 and the first block portion 16 to each other. The first connecting portion 113 has the same thickness as the first pad portion 111. The first connecting portion 113 is covered with the sealing resin 50, except for an area that faces the same side as the first reverse surface 111B of the first pad portion 111 in the thickness direction z. The area is flush with the first reverse surface 111B and covered with the outer conductive layer 18.

As shown in FIGS. 2 and 7, the first block portion 16 is located opposite ("one side" defined in the claims of the present disclosure) from the first terminal portion 112 with respect to the first pad portion 111 in the first direction x. The first block portion 16 protrudes from the sealing resin 50 in the first direction x. The first block portion 16 has the same thickness as the first pad portion 111. As shown in FIG. 5, the first block portion 16 has a first covered surface 161 and a pair of first exposed surfaces 162. The surface of the first block portion 16 protruding from the sealing resin 50 is composed of the first covered surface 161 and the pair of first exposed surfaces 162.

As shown in FIG. 5, the first covered surface 161 is covered with the outer conductive layer 18. The pair of first exposed surfaces 162 are not covered with the outer conductive layer 18, resulting in the base material of the first block portion 16 being exposed. The pair of first exposed surfaces 162 are separated from each other in the second direction y, and face in a direction perpendicular to the thickness direction z.

As shown in FIGS. 2 and 5, the first covered surface 161 has a first area 161A and a pair of second areas 161B. The first area 161A is sandwiched between the pair of first exposed surfaces 162 in the second direction y, and faces in the first direction x. The pair of second areas 161B face away from each other in the second direction y. Each of the second areas 161B is connected to the corresponding first exposed surface 162. Each of the second areas 161B is located opposite from the first area 161A with respect to the first exposed surface 162 adjacent in the second direction y.

As shown in FIG. 2, in the semiconductor device A10, the first area 161A is located farther away from the first pad portion 111 than the pair of second areas 161B in the first direction x. The first exposed surfaces 162 are connected to the first area 161A. The first exposed surfaces 162 are inclined to both the first area 161A and the second areas 161B.

In the first lead 11, the first pad portion 111, the first connecting portion 113, and the first block portion 16 function as heat dissipators (heatsinks). While the semiconductor device A10 is in use, heat generated from the first switching element 21 is transferred to the first pad portion 111, the first connecting portion 113, and the first block portion 16 to be released to the outside.

As shown in FIG. 2, the second lead 12 is arranged away from the first lead 11 in the second direction y, and has the second switching element 22 mounted thereon. The second lead 12 has a second pad portion 121, a second terminal portion 122, a second connecting portion 123, and a second block portion 17.

As shown in FIGS. 2, 8, and 9, the second switching element 22 is mounted on the second pad portion 121. The second pad portion 121 is rectangular as viewed in the thickness direction z. The second pad portion 121 has a second obverse surface 121A and a second reverse surface 121B. The second obverse surface 121A faces the same side as the first obverse surface 111A of the first pad portion 111 (first lead 11) in the thickness direction z. The second obverse surface 121A is covered with the first inner conductive layer 191. As shown in FIGS. 3 and 8, the second reverse surface 121B faces away from the second obverse surface 121A in the thickness direction z. The second pad portion 121 is covered with the sealing resin 50, except for the second reverse surface 121B. The second reverse surface 121B is covered with the outer conductive layer 18.

As shown in FIG. 2, the second terminal portion 122 is located opposite from the second block portion 17 with respect to the second pad portion 121 in the first direction x. The second terminal portion 122 is an output terminal for receiving AC power converted from DC power by the first switching element 21 and the second switching element 22. The second terminal portion 122 has a strip-like shape extending from the second pad portion 121 in the first direction x as viewed in the thickness direction z. The second terminal portion 122 has a second covered portion 122A and a second exposed portion 122B.

As shown in FIGS. 2 and 8, the second covered portion 122A is covered with the sealing resin 50. One end of the second covered portion 122A in the first direction x is connected to the second pad portion 121, and is inclined to both the first direction x and the thickness direction z. In the semiconductor device A10, the second covered portion 122A has an area facing the same side as the second obverse surface 121A of the second pad portion 121 in the thickness direction z, and the area has a portion covered with the first inner conductive layer 191.

As shown in FIGS. 2, 6, and 8, the second exposed portion 122B protrudes from the sealing resin 50 in the first direction x as viewed in the thickness direction z. The second exposed portion 122B is bent in a hook shape as viewed in the second direction y, and is covered with the outer conductive layer 18.

As shown in FIGS. 2 and 8, the second connecting portion 123 connects the second pad portion 121 and the second block portion 17 to each other. The second connecting portion 123 has the same thickness as the second pad portion 121. The second connecting portion 123 is covered with the sealing resin 50, except for an area that faces the same side as the second reverse surface 121B of the second pad portion 121 in the thickness direction z. The area is flush with the second reverse surface 121B and covered with the outer conductive layer 18.

As shown in FIGS. 2 and 8, the second block portion 17 is located opposite from the second terminal portion 122 with respect to the second pad portion 121 in the first direction x. The second block portion 17 protrudes from the sealing resin 50 in the first direction x to the same side as the first lead 11 of the first block portion 16. The second block portion 17 has the same thickness as the second pad portion 121. As shown in FIG. 5, the second block portion 17 has a second covered surface 171 and a pair of second exposed surfaces 172. The surface of the second block port ion 17 protruding from the sealing resin 50 is composed of the second covered surface 171 and the pair of second exposed surfaces 172.

As shown in FIG. 5, the second covered surface 171 is covered with the outer conductive layer 18. The pair of second exposed surfaces 172 are not covered with the outer conductive layer 18, resulting in the base material of the second block portion 17 being exposed. The pair of second exposed surfaces 172 are separated from each other in the second direction y, and face in a direction perpendicular to the thickness direction z.

As shown in FIGS. 2 and 5, the second covered surface 171 has a third area 171A and a pair of fourth areas 171B. The third area 171A is sandwiched between the pair of second exposed surfaces 172 in the second direction y, and faces in the first direction x. The pair of fourth areas 171B face away from each other in the second direction y. Each of the fourth areas 171B is connected to the corresponding second exposed surface 172. Each of the fourth areas 171B is located opposite from the third area 171A with respect to the second exposed surface 172 adjacent in the second direction y.

As shown in FIG. 2, in the semiconductor device A10, the third area 171A is located farther away from the second pad portion 121 than the pair of fourth areas 171B in the first direction x. The second exposed surfaces 172 are connected to the third area 171A. The second exposed surfaces 172 are inclined to both the third area 171A and the fourth areas 171B.

In the second lead 12, the second pad portion 121, the second connecting portion 123, and the second block portion 17 function as heat dissipators (heatsinks). While the semiconductor device A10 is in use, heat generated from the second switching element 22 is transferred to the second pad portion 121, the second connecting portion 123, and the second block portion 17 to be released to the outside.

As shown in FIG. 2, the third lead 13 is arranged between the first terminal portion 112 of the first lead 11 and the second terminal portion 122 of the second lead 12 as viewed in the thickness direction z. The third lead 13 is electrically connected to the second switching element 22. The third lead 13 has a third pad portion 131 and a third terminal portion 132.

Figure 10:
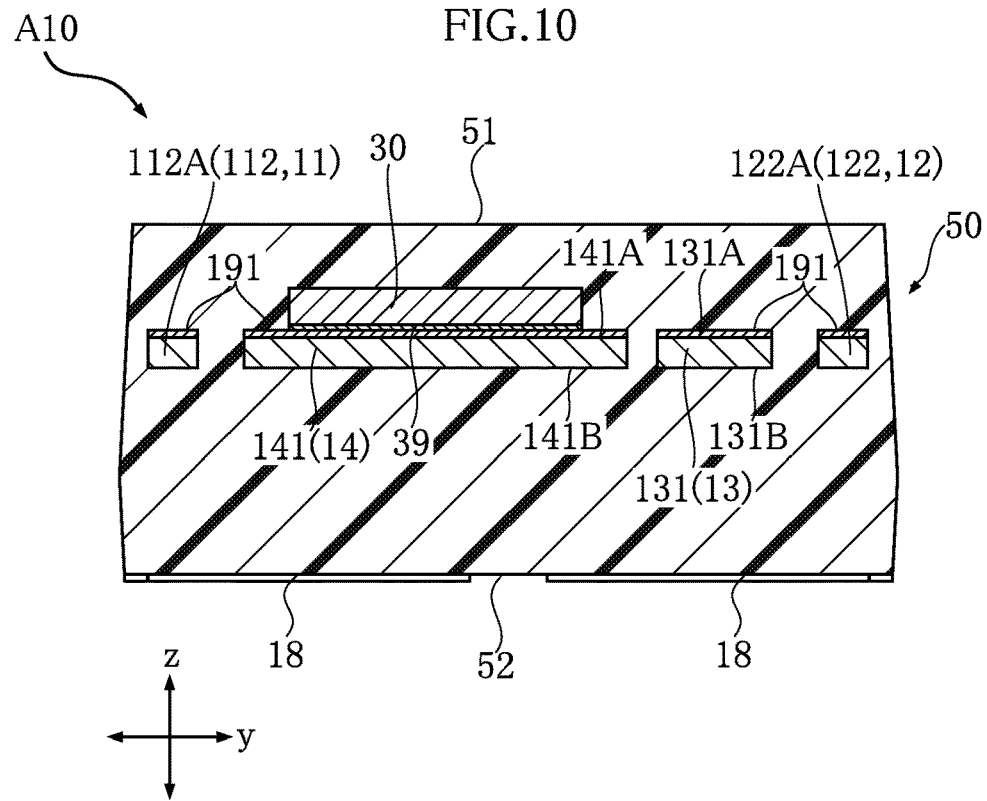
FIG. 10 is a cross-sectional view taken along line X-X in FIG. 2.

As shown in FIG. 2, the third pad portion 131 faces the second pad portion 121 of the second lead 12 as viewed in the thickness direction z. The third pad portion 131 is rectangular as viewed in the thickness direction z. Also, as shown in FIG. 10, the third pad portion 131 is covered with the sealing resin 50. The third pad portion 131 has a third obverse surface 131A and a third reverse surface 131B. The third obverse surface 131A faces the same side as the first obverse surface 111A of the first pad portion 111 (first lead 11) in the thickness direction z. The third obverse surface 131A is covered with the first inner conductive layer 191. The third reverse surface 131B faces away from the third obverse surface 131A in the thickness direction z.

As shown in FIG. 2, the third terminal portion 132 is located opposite from the second pad portion 121 of the second lead 12 with respect to the third pad portion 131 in the first direction x. The third terminal portion 132 is a negative electrode terminal (N terminal) for inputting DC power, which is to be converted by the first switching element 21 and the second switching element 22. The third terminal portion 132 has a strip-like shape extending from the third pad portion 131 in the first direction x as viewed in the thickness direction z. The third terminal portion 132 has a third covered portion 132A and a third exposed portion 132B.

As shown in FIG. 2, the third covered portion 132A is covered with the sealing resin 50. One end of the third covered portion 132A in the first direction x is connected to the third pad portion 131. In the semiconductor device A10, the third covered portion 132A has an area facing the same side as the third obverse surface 131A of the third pad portion 131 in the thickness direction z, and the area has a portion covered with the second inner conductive layer 192.

As shown in FIG. 2, the third exposed portion 132B protrudes from the sealing resin 50 in the first direction x as viewed in the thickness direction z. As can be inferred from FIGS. 4 and 6, the third exposed portion 132B is bent in a hook shape as viewed in the second direction y, and is covered with the outer conductive layer 18.

As shown in FIG. 2, the fourth lead 14 is arranged between the first terminal portion 112 of the first lead 11 and the third lead 13 as viewed in the thickness direction z, and has the drive IC 30 mounted thereon. The fourth lead 14 has a fourth pad portion 141 and a fourth terminal portion 142.

As shown in FIG. 2, the fourth pad portion 141 faces both the first pad portion 111 of the first lead 11 and the second pad portion 121 of the second lead 12 as viewed in the thickness direction z. The fourth pad portion 141 is rectangular as viewed in the thickness direction z. Also, as shown in FIG. 10, the fourth pad portion 141 is covered with the sealing resin 50. The fourth pad portion 141 has a fourth obverse surface 141A and a fourth reverse surface 141B. The fourth obverse surface 141A faces the same side as the first obverse surface 111A of the first pad portion 111 (first lead 11) in the thickness direction z. The fourth obverse surface 141A is covered with the first inner conductive layer 191. The fourth reverse surface 141B faces away from the fourth obverse surface 141A in the thickness direction z.

As shown in FIG. 2, the fourth terminal portion 142 is located opposite from both the first pad portion 111 of the first lead 11 and the second pad portion 121 of the second lead 12 with respect to the fourth pad portion 141 in the first direction x. The fourth terminal portion 142 is electrically connected to the drive IC 30, and is involved with the drive and control of the drive IC 30. The fourth terminal portion 142 has a strip-like shape extending from the fourth pad portion 141 in the first direction x as viewed in the thickness direction z. The fourth terminal portion 142 has a fourth covered portion 142A and a fourth exposed portion 142B.

As shown in FIG. 2, the fourth covered portion 142A is covered with the sealing resin 50. One end of the fourth covered portion 142A in the first direction x is connected to the fourth pad portion 141. In the semiconductor device A10, the fourth covered portion 142A has an area facing the same side as the fourth obverse surface 141A of the fourth pad portion 141 in the thickness direction z, and the area has a portion covered with the second inner conductive layer 192.

As shown in FIG. 2, the fourth exposed portion 142B protrudes from the sealing resin 50 in the first direction x as viewed in the thickness direction z. As can be inferred from FIGS. 4 and 6, the fourth exposed portion 142B is bent in a hook shape as viewed in the second direction y, and is covered with the outer conductive layer 18.

As shown in FIG. 2, the plurality of fifth leads 15 are arranged between the first terminal portion 112 of the first lead 11 and the second terminal portion 122 of the second lead 12 in the second direction y. In the semiconductor device A10, two fifth leads 15 are arranged between the first terminal portion 112 and the fourth terminal portion 142 of the fourth lead 14 in the second direction y. In addition, three fifth leads 15 are arranged between the fourth terminal portion 142 and the third terminal portion 132 of the third lead 13 in the second direction y. Note that the number of arrays of the plurality of fifth leads 15 and other structures are not limited to those described above. The fifth leads 15 are electrically connected to the drive IC 30, and are involved with the drive and control of the drive IC 30. Each of the fifth leads 15 has a fifth covered portion 151 and a fifth exposed portion 152.

As shown in FIG. 2, the fifth covered portion 151 is covered with the sealing resin 50. In the semiconductor device A10, the fifth covered portion 151 has an area facing the same side as the fourth obverse surface 141A of the fourth pad portion 141 (fourth lead 14) in the thickness direction z, and the area has a portion covered with the second inner conductive layer 192.

As shown in FIG. 2, the fifth exposed portion 152 protrudes from the sealing resin 50 in the first direction x as viewed in the thickness direction z. As can be inferred from FIGS. 4 and 6, the fifth exposed portion 152 is bent in a hook shape as viewed in the second direction y, and is covered with the outer conductive layer 18.

Figure 11:
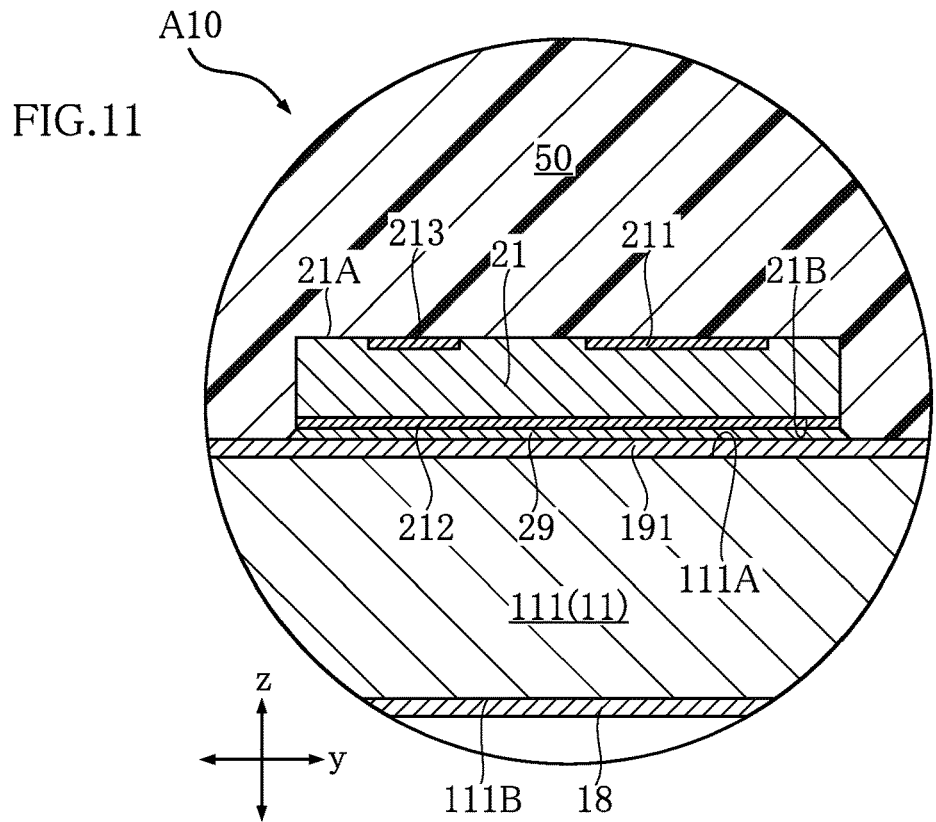
FIG. 11 is a partially enlarged view (in the vicinity of a first switching element) of FIG. 9.

As shown in FIGS. 2, 7, and 9, the first switching element 21 is electrically bonded to the first obverse surface 111A of the first pad portion 111 (first lead 11), and is electrically connected to the second lead 12. The first switching element 21 is a MOSFET (Metal-Oxide-Semiconductor Field-Effect Transistor) containing silicon (Si) or silicon carbide (SiC) as a main component. Alternatively, the first switching element 21 may be an IGBT (Insulated Gate Bipolar Transistor). The description of the semiconductor device A10 is provided assuming that the first switching element 21 is an n-channel MOSFET. As shown in FIG. 11, the first switching element 21 has a first element obverse surface 21A, a first element reverse surface 21B, a first obverse-surface electrode 211, a first reverse-surface electrode 212, and a first gate electrode 213. The first element obverse surface 21A faces the same side as the first obverse surface 111A in the thickness direction z. The first element reverse surface 21B faces away from the first element obverse surface 21A in the thickness direction z.

As shown in FIGS. 2 and 11, the first obverse-surface electrode 211 is provided on the first element obverse surface 21A. The first obverse-surface electrode 211 receives power from the first switching element 21. In other words, the first obverse-surface electrode 211 is a source electrode of the first switching element 21. The source current of the first switching element 21 flows through the first obverse-surface electrode 211.

As shown in FIG. 11, the first reverse-surface electrode 212 is provided to cover the entirety of the first element reverse surface 21B. The first reverse-surface electrode 212 receives power that is to be output to the first switching element 21. In other words, the first reverse-surface electrode 212 is a drain electrode of the first switching element 21. The drain current of the first switching element 21 flows through the first reverse-surface electrode 212.

As shown in FIGS. 2 and 11, the first gate electrode 213 is provided on the first element obverse surface 21A. Gate voltage for driving the first switching element 21 is applied to the first gate electrode 213. In other words, the first gate electrode 213 is a gate electrode of the first switching element 21. The first gate electrode 213 has smaller area than the first obverse-surface electrode 211 as viewed in the thickness direction z.

Figure 12:
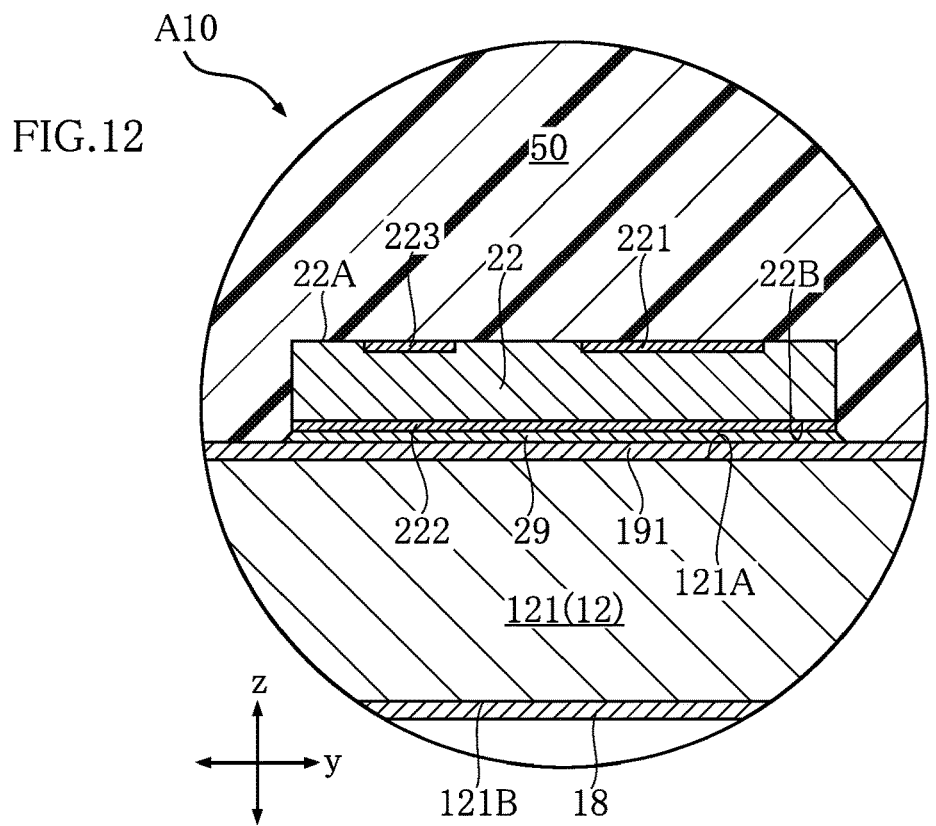
FIG. 12 is a partially enlarged view (in the vicinity of a second switching element) of FIG. 9.

As shown in FIGS. 2, 8, and 9, the second switching element 22 is electrically bonded to the second obverse surface 121A of the second pad portion 121 (second lead 12). The second switching element 22 is a semiconductor element identical to the first switching element 21. Accordingly, the description of the semiconductor device A10 is provided assuming that the second switching element 22 is an n-channel MOSFET. As shown in FIG. 12, the second switching element 22 has a second element obverse surface 22A, a second element reverse surface 22B, a second obverse-surface electrode 221, a second reverse-surface electrode 222, and a second gate electrode 223. The second element obverse surface 22A faces the same side as the second obverse surface 121A in the thickness direction z. The second element reverse surface 22B faces away from the second element obverse surface 22A in the thickness direction z.

As shown in FIGS. 2 and 12, the second obverse-surface electrode 221 is provided on the second element obverse surface 22A. The second obverse-surface electrode 221 is a source electrode of the second switching element 22. The source current of the second switching element 22 flows through the second obverse-surface electrode 221.

As shown in FIG. 12, the second reverse-surface electrode 222 is provided to cover the entirety of the second element reverse surface 22B. The second reverse-surface electrode 222 is a drain electrode of the second switching element 22. The drain current of the second switching element 22 flows through the second reverse-surface electrode 222.

As shown in FIGS. 2 and 12, the second gate electrode 223 is provided on the second element obverse surface 22A. Gate voltage for driving the second switching element 22 is applied to the second gate electrode 223. The second gate electrode 223 has smaller area than the second obverse-surface electrode 221 as viewed in the thickness direction z.

As shown in FIGS. 11 and 12, the semiconductor device A10 includes a conductive joint layer 29. The conductive joint layer 29 is interposed between the first inner conductive layer 191 covering the first obverse surface 111A of the first pad portion 111 (first lead 11), and the first reverse-surface electrode 212 of the first switching element 21. The conductive joint layer 29 is also interposed between the first inner conductive layer 191 covering the second obverse surface 121A of the second pad portion 121 (second lead 12), and the second reverse-surface electrode 222 of the second switching element 22. The conductive joint layer 29 is lead-free solder containing tin as a main component, for example. The first switching element 21 is electrically bonded to the first obverse surface 111A by means of the conductive joint layer 29. As a result, the first reverse-surface electrode 212 is electrically connected to the first lead 11. Similarly, the second switching element 22 is electrically bonded to the second obverse surface 121A by means of the conductive joint layer 29. As a result, the second reverse-surface electrode 222 is electrically connected to the second lead 12.

As shown in FIGS. 2 and 10, the drive IC 30 is mounted on the fourth pad portion 141 of the fourth lead 14. The drive IC 30 is a gate driver for driving and controlling the first switching element 21 and the second switching element 22. The drive IC 30 is electrically connected to the first gate electrode 213 of the first switching element 21 and the second gate electrode 223 of the second switching element 22. As a result, the gate voltage generated from the drive IC 30 based on an input signal from the outside is applied to both the first gate electrode 213 and the second gate electrode 223. The drive IC 30 has an area facing the same side as the fourth obverse surface 141A of the fourth pad portion 141 in the thickness direction z, and a plurality of electrodes 31 are provided in this area. The plurality of electrodes 31 are electrically connected to the first obverse-surface electrode 211 of the first switching element 21, in addition to the first gate electrode 213 and the second gate electrode 223. In the semiconductor device A10, the plurality of electrodes 31 are also electrically connected to the first terminal portion 112 of the first lead 11, the third terminal portion 132 of the third lead 13, the fourth terminal portion 142 of the fourth lead 14, and the plurality of fifth leads 15. The plurality of electrodes 31 are made of aluminum (Al), for example.

As shown in FIG. 10, the semiconductor device A10 includes an adhesive layer 39. The adhesive layer 39 is interposed between the first inner conductive layer 191 covering the fourth obverse surface 141A of the fourth pad portion 141 (fourth lead 14), and the drive IC 30. The adhesive layer 39 is made of silver paste containing epoxy resin as a main agent, for example. The drive IC 30 is bonded to the fourth obverse surface 141A by means of the adhesive layer 39.

As shown in FIG. 2, the first wire 41 is a conductive member connected to both the first obverse-surface electrode 211 of the first switching element 21 and the second connecting portion 123 of the second lead 12. The first switching element 21 (first obverse-surface electrode 211) is electrically connected to the second lead 12 by means of the first wire 41. The first wire 41 is made of aluminum, for example.

As shown in FIG. 2, the second wire 42 is a conductive member connected to both the second obverse-surface electrode 221 of the second switching element 22 and the third obverse surface 131A of the third pad portion 131 (third lead 13). An end of the second wire 42 connected to the third obverse surface 131A is in contact with the first inner conductive layer 191 covering the third obverse surface 131A. The third lead 13 (third pad portion 131) is electrically connected to the second switching element 22 (second obverse-surface electrode 221) by means of the second wire 42. The second wire 42 is made of aluminum, for example.

As shown in FIG. 2, the semiconductor device A10 includes a plurality of third wires 43, a first gate wire 441, a second gate wire 442, a first detection wire 451, a second detection wire 452, and a third detection wire 453. These wires are conductive members each having an end connected to one of the electrodes 31 of the drive IC 30. These wires are made of gold (Au), for example.

As shown in FIG. 2, the third wires 43 are connected to the respective electrodes 31 of the drive IC 30, and are each connected to either the fourth covered portion 142A of the fourth terminal portion 142 (fourth lead 14) or one of the fifth covered portions 151 of the fifth leads 15. An end of each third wire 43 connected to either the fourth covered portion 142A or one of the plurality of fifth covered portions 151 is in contact with the corresponding second inner conductive layer 192 covering a portion of either the fourth covered portion 142A or one of the fifth covered portions 151. The plurality of third wires 43 allow the fourth terminal portion 142 and the fifth leads 15 to be electrically connected to the drive IC 30.

As shown in FIG. 2, the first gate wire 441 is connected to one of the electrodes 31 of the drive IC 30 and the first gate electrode 213 of the first switching element 21. The first gate wire 441 allows the drive IC 30 to be electrically connected to the first switching element 21 (first gate electrode 213), and allows the gate voltage generated from the drive IC 30 to be applied to the first gate electrode 213.

As shown in FIG. 2, the second gate wire 442 is connected to one of the electrodes 31 of the drive IC 30 and the second gate electrode 223 of the second switching element 22. The second gate wire 442 allows the drive IC 30 to be electrically connected to the second switching element 22 (second gate electrode 223), and allows the gate voltage generated from the drive IC 30 to be applied to the second gate electrode 223.

As shown in FIG. 2, the first detection wire 451 is connected to one of the electrodes 31 of the drive IC 30 and the first obverse-surface electrode 211 of the first switching element 21. The first detection wire 451 allows the drive IC 30 to detect the source current flowing through the first obverse-surface electrode 211.

As shown in FIG. 2, the second detection wire 452 is connected to one of the electrodes 31 of the drive IC 30 and the first covered portion 112A of the first terminal portion 112 (first lead 11). An end of the second detection wire 452 connected to the first covered portion 112A is in contact with the second inner conductive layer 192 covering a portion of the first covered portion 112A. The second detection wire 452 allows the drive IC 30 to detect the drain current flowing through the first reverse-surface electrode 212 of the first switching element 21.

As shown in FIG. 2, the third detection wire 453 is connected to one of the electrodes 31 of the drive IC 30 and the third covered portion 132A of the third terminal portion 132 (third lead 13). An end of the third detection wire 453 connected to the third covered portion 132A is in contact with the second inner conductive layer 192 covering a portion of the third covered portion 132A. The third detection wire 453 allows the drive IC 30 to detect the drain current flowing through the second reverse-surface electrode 222 of the second switching element 22.

Figure 4:
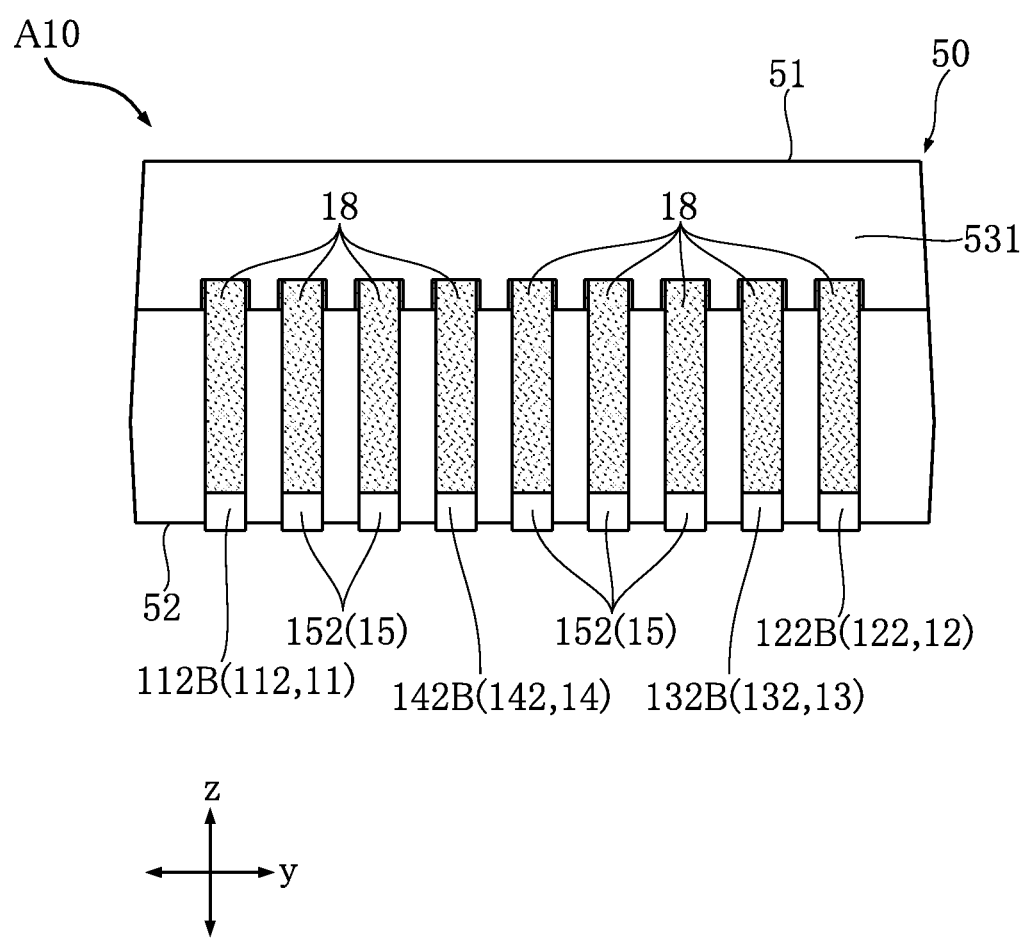
FIG. 4 is a front view showing the semiconductor device of FIG. 1.

As shown in FIG. 2, the sealing resin 50 covers portions of the first lead 11, the second lead 12, the third lead 13, the fourth lead 14, and the plurality of fifth leads 15, and also covers the first switching element 21 and the second switching element 22. The sealing resin 50 is made of a black epoxy resin, for example. As shown in FIGS. 4 and 5, the sealing resin 50 has a top surface 51, a bottom surface 52, a first side surface 531, and a second side surface 532.

As shown in FIGS. 4, 5, and 7, the top surface 51 faces the same side as the first obverse surface 111A of the first pad portion 111 (first lead 11) in the thickness direction z. As shown in FIGS. 4 and 5, the bottom surface 52 faces away from the top surface 51 in the thickness direction z. As shown in FIG. 3 and FIGS. 7 to 9, the first reverse surface 111B of the first pad portion 111 and the second reverse surface 121B of the second pad portion 121 (second lead 12) are exposed from the bottom surface 52. In the semiconductor device A10, the first connecting portion 113 of the first lead 11 and the second connecting portion 123 of the second lead 12 each have an area facing the same side as the first reverse surface 111B in the thickness direction z, and these areas are exposed from the bottom surface 52.

As shown in FIG. 3, the first side surface 531 and the second side surface 532 are separated and face away from each other in the first direction x. As shown in FIGS. 4 and 5, both ends of each of the first side surface 531 and the second side surface 532 in the thickness direction z are connected to the top surface 51 and the bottom surface 52. The first side surface 531 is located on the side where the first terminal portion 112 is located with respect to the first pad portion 111 of the first lead 11, as viewed in the thickness direction z. The second side surface 532 is located on the side where the first connecting portion 113 is located with respect to the first pad portion 111, as viewed in the thickness direction z.

As shown in FIG. 4, the first exposed portion 112B of the first terminal portion 112 (first lead 11), the second exposed portion 122B of the second terminal portion 122 (second lead 12), and the third exposed portion 132B of the third terminal portion 132 (third lead 13) protrude from the first side surface 531 in the first direction x as viewed in the thickness direction z. In the semiconductor device A10, the fourth exposed portion 142B of the fourth terminal portion 142 (fourth lead 14) and the fifth exposed portions 152 of the plurality of fifth leads 15 also protrude from the first side surface 531 in the first direction x as viewed in the thickness direction z. Also, as viewed in FIG. 5, the first block portion 16 of the first lead 11 and the second block portion 17 of the second lead 12 protrude from the second side surface 532 in the first direction x.

Figure 13:
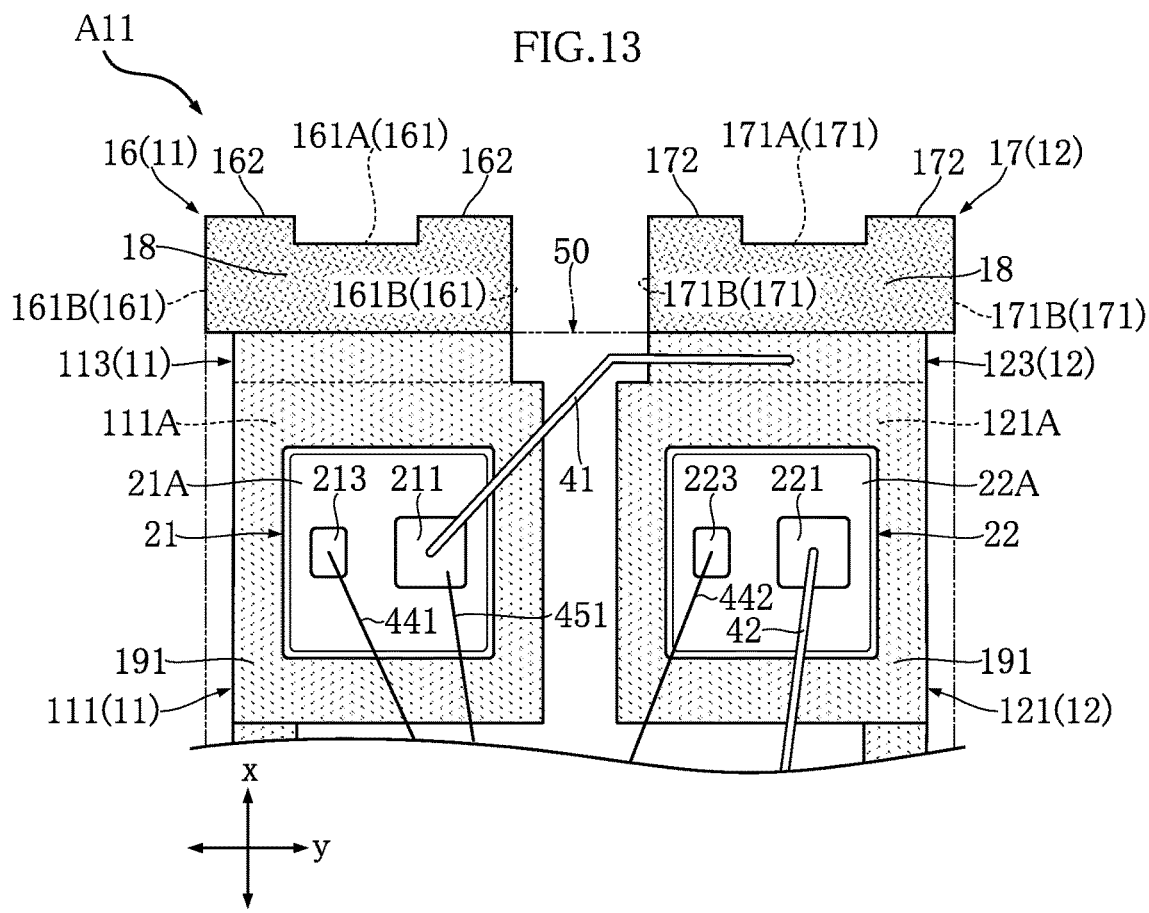
FIG. 13 is a plan view showing a first modification of the semiconductor device of FIG. 1 (a sealing resin is shown transparent)
Figure 14:
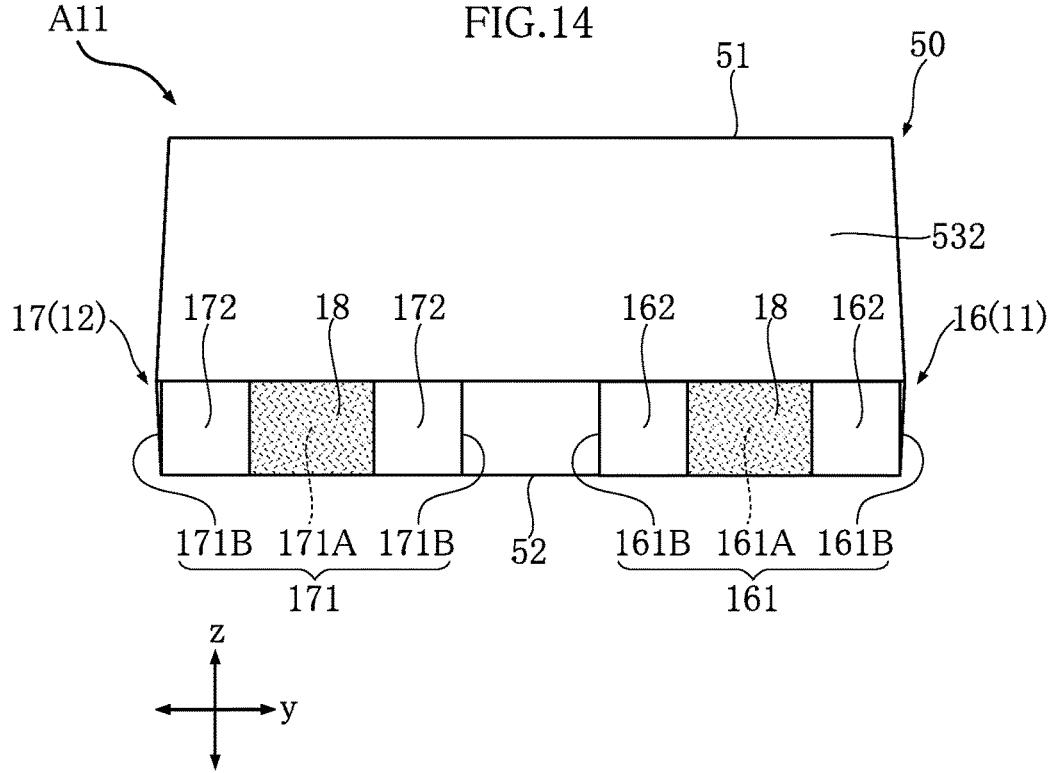
FIG. 14 is a rear view showing the semiconductor device of FIG. 13.

The following describes a semiconductor device A11 according to a first modification of the semiconductor device A10, with reference to FIGS. 13 and 14. In FIG. 13, the sealing resin 50 is shown transparent for ease of understanding. In FIG. 13, the sealing resin 50 is indicated by imaginary lines. Also, in FIGS. 13 and 14, areas covered by the outer conductive layer 18 and the first inner conductive layer 191 are hatched for ease of understanding.

The semiconductor device A11 differs from the above-described semiconductor device A10 in the structure of the first block portion 16 of the first lead 11 and the second block portion 17 of the second lead 12.

As shown in FIG. 13, the pair of first exposed surfaces 162 of the semiconductor device A11 are located farther away from the first pad portion 111 of the first lead 11 than the first area 161A of the first covered surface 161 in the first direction x. As shown in FIGS. 13 and 14, the pair of first exposed surfaces 162 are provided along both the thickness direction z and the second direction y.

As shown in FIG. 13, the pair of second exposed surfaces 172 of the semiconductor device A11 are located farther away from the second pad portion 121 of the second lead 12 than the third area 171A of the second covered surface 171 in the first direction x. As shown in FIGS. 13 and 14, the pair of second exposed surfaces 172 are provided along both the thickness direction z and the second direction y.

Figure 15:
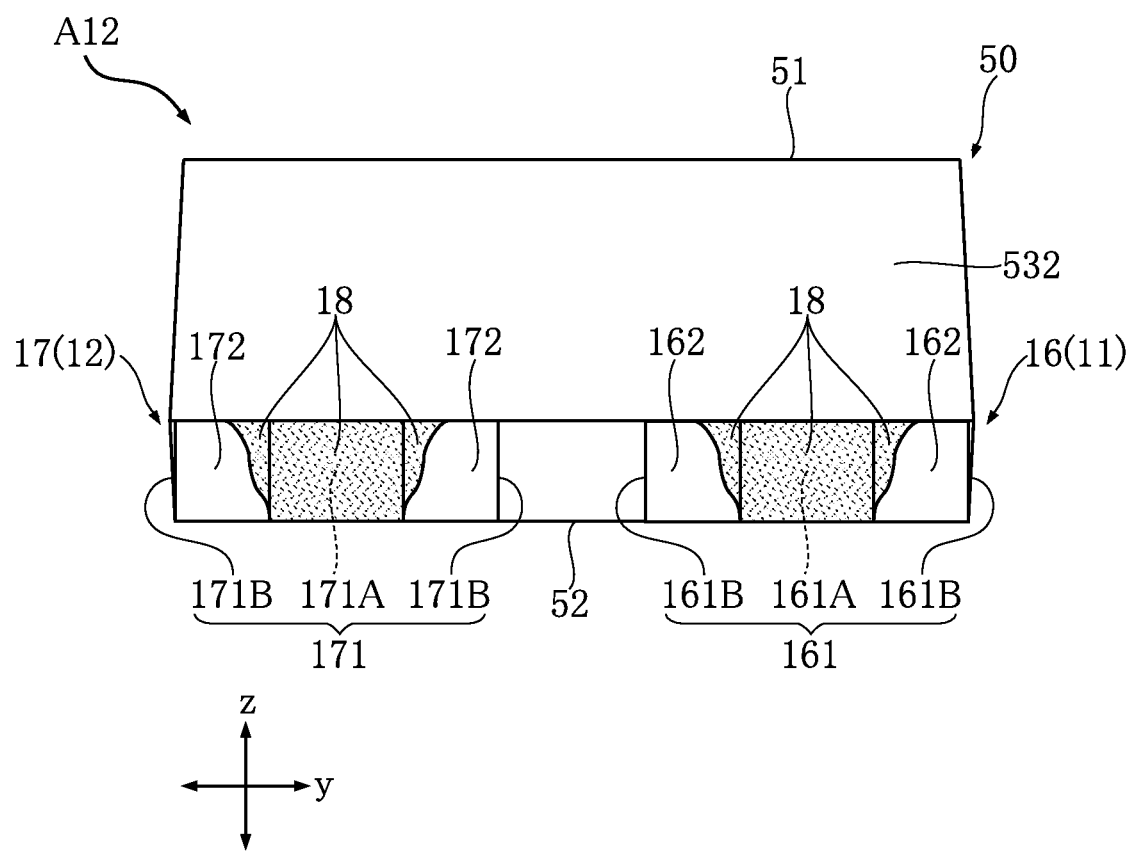
FIG. 15 is a rear view showing a second modification of the semiconductor device of FIG. 1.

Next, a semiconductor device A12 according to a second modification of the semiconductor device A10 will be described with reference to FIG. 15. In FIG. 15, areas covered by the outer conductive layer 18 are hatched for ease of understanding.

Figure 20:
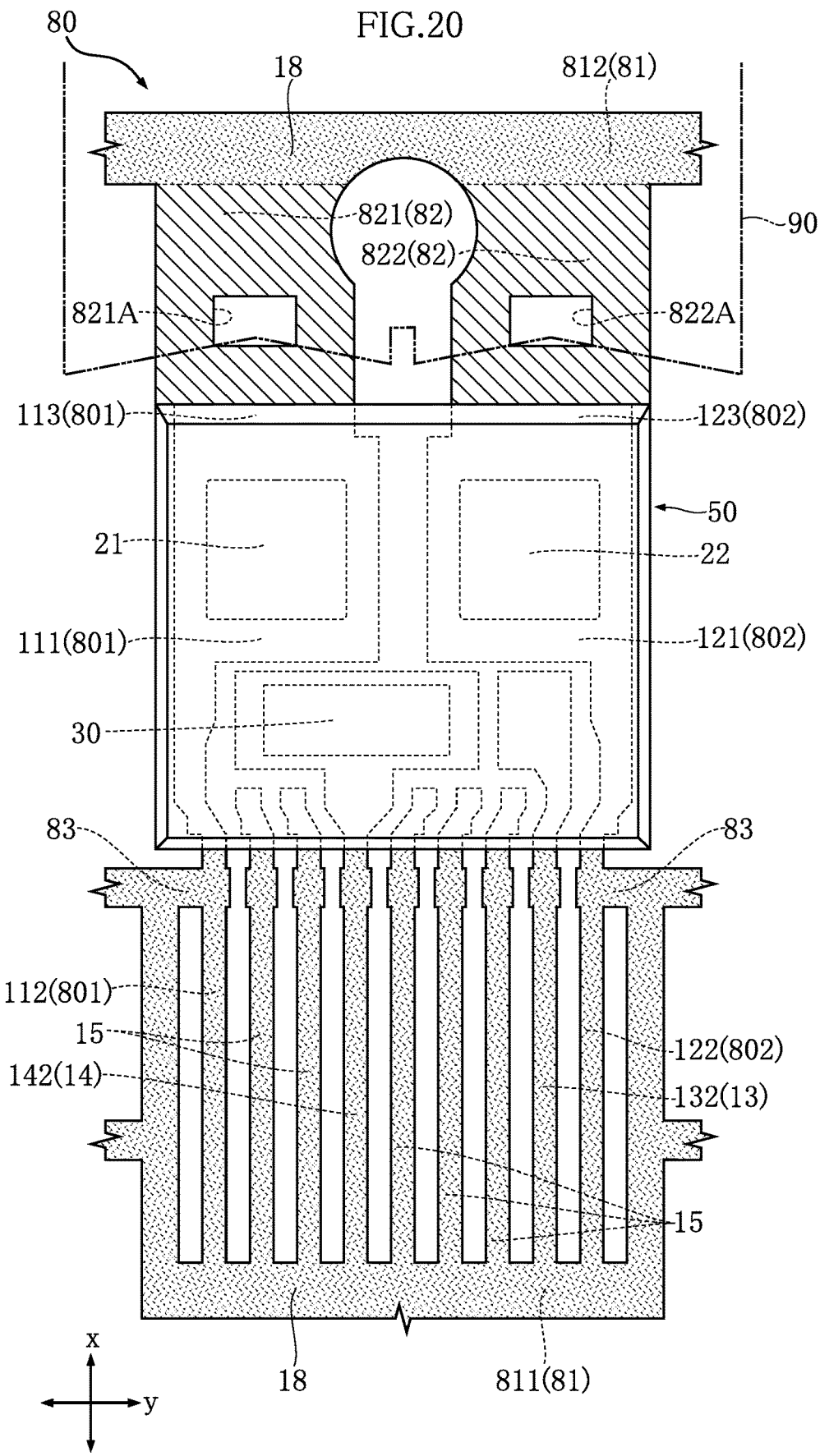
FIG. 20 is a plan view for describing a step of manufacturing the semiconductor device shown in FIG. 1.

As shown in FIG. 15, in the semiconductor device A12, the first area 161A of the first covered surface 161 extends over portions of the pair of first exposed surfaces 162 in the semiconductor device A10. In addition, in the semiconductor device A12, the third area 171A of the second covered surface 171 extends over portions of the pair of second exposed surfaces 172 in the semiconductor device A10. Such shapes of the first area 161A and the third area 171A are formed during a process using an example of a method for manufacturing the semiconductor device A10, which is described below. Specifically, as shown in FIG. 20, these shapes are formed due to sagging of the outer conductive layer 18 caused when a first connection band 821 and a second connection band 822 are cut along a cut line 90.

Figure 16:
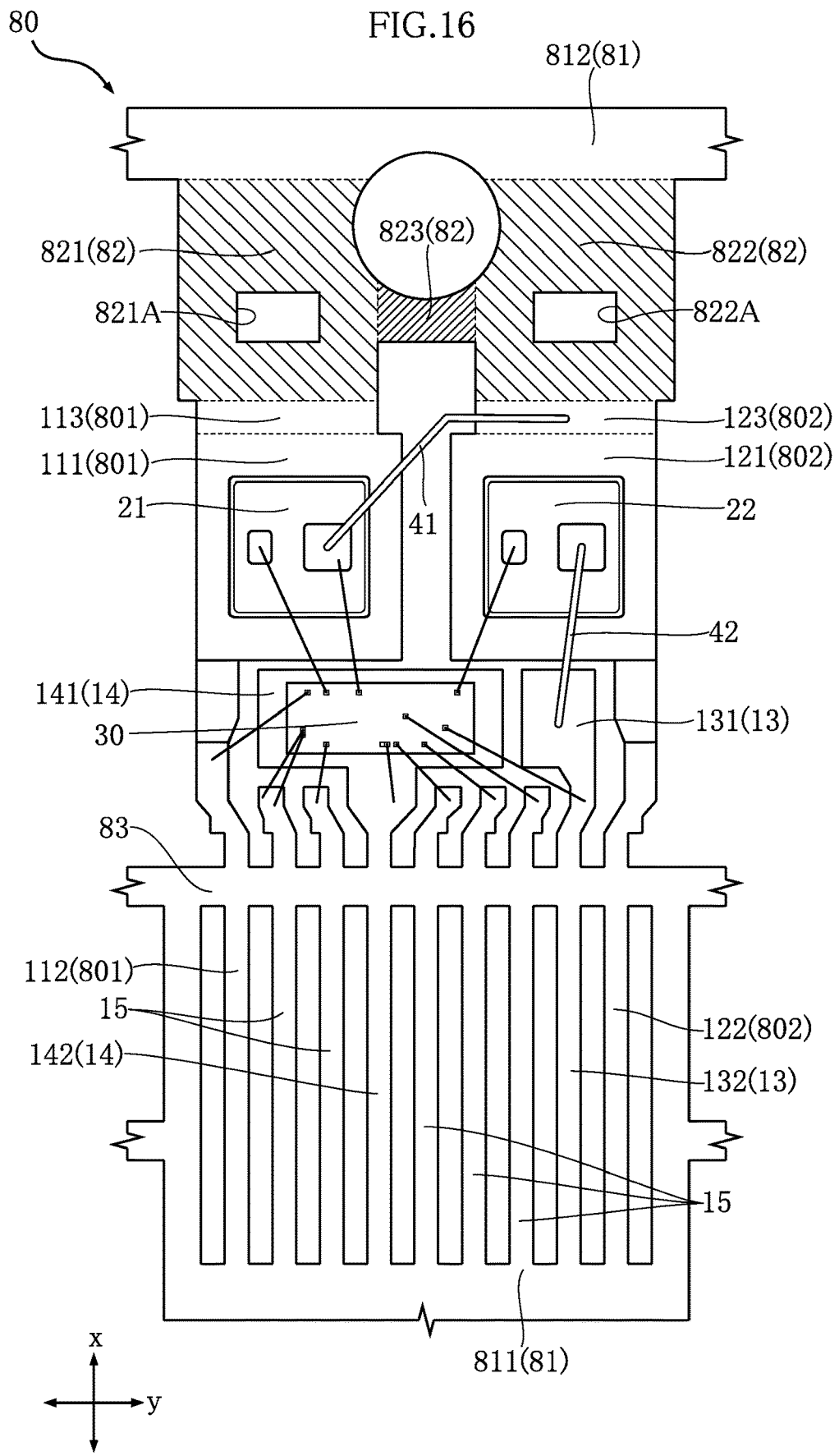
FIG. 16 is a plan view for describing a step of manufacturing the semiconductor device shown in FIG. 1.
Figure 17:
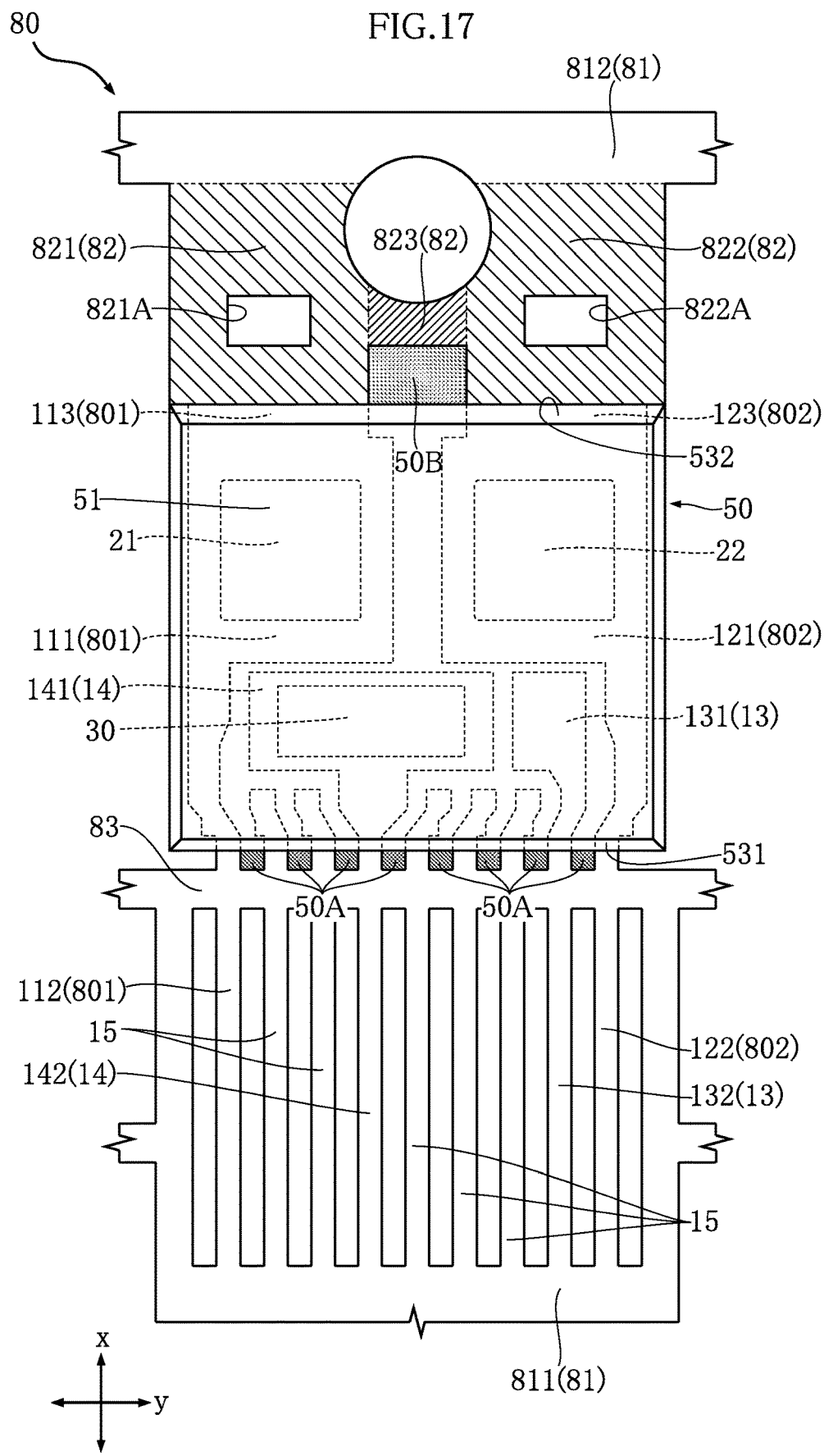
FIG. 17 is a plan view for describing a step of manufacturing the semiconductor device shown in FIG. 1.

Next, an example of a method for manufacturing the semiconductor device A10 will be described with reference to FIGS. 16 to 24. In these figures, elements that are the same as or similar to those of the semiconductor device A10 described above are provided with the same reference signs, and descriptions thereof are omitted. In FIGS. 16 to 20, and FIG. 23, areas occupied by a first connection band 821 and a second connection band 822, which are described below, are hatched for ease of understanding. In FIGS. 16 and 17, an area occupied by an intermediate connection band 823, which is described below, is hatched for ease of understanding. In FIGS. 19 to 24, an area covered by an outer conductive layer 18 is hatched for ease of understanding.

First, as shown in FIG. 16, a first switching element 21 and a second switching element 22 are electrically bonded to a lead frame 80 by die bonding. The lead frame 80 includes a first lead 801, a second lead 802, a third lead 13, a fourth lead 14, and a plurality of fifth leads 15. The first lead 801 is a portion of the lead frame 80, and includes the first pad portion 111, the first terminal portion 112, and the first connecting portion 113 of the above-described first lead 11. The second lead 802 is a portion of the lead frame 80, and includes the second pad portion 121, the second terminal portion 122, and the second connecting portion 123 of the above-described second lead 12. The lead frame 80 further includes an outer frame portion 81, a first tie bar 82, and a second tie bar 83.

As shown in FIG. 16, the outer frame portion 81 forms the outer periphery of the lead frame 80. The outer frame portion 81 has a first frame portion 811 and a second frame portion 812. The first frame portion 811 has a U shape as viewed in the thickness direction z. The first terminal portion 112 of the first lead 801, the second terminal portion 122 of the second lead 802, a third terminal portion 132 of the third lead 13, a fourth terminal portion 142 of the fourth lead 14, and the plurality of fifth leads 15 are all connected to the first frame portion 811 in the first direction x. The second frame portion 812 is located opposite from the first frame portion 811 with respect to both the first lead 801 and the second lead 802 in the first direction x. The second frame portion 812 has a strip-like shape extending in the second direction y as viewed in the thickness direction z.

As shown in FIG. 16, the first tie bar 82 protrudes from the second frame portion 812 toward both the first lead 801 and the second lead 802 in the first direction x. The first tie bar 82 has a first connection band 821, a second connection band 822, and an intermediate connection band 823. The first connection band 821 protrudes from the second frame portion 812 in the first direction x. The first connection band 821 connects the second frame portion 812 and the first connecting portion 113 of the first lead 801 to each other. The first connection band 821 is provided with a first through-hole 821A penetrating in the thickness direction z. The first through-hole is rectangular as viewed in the thickness direction z. The second connection band 822 protrudes from the second frame portion 812 in the first direction x, and is separated from the first connection band 821 in the second direction y. The second connection band 822 connects the second frame portion 812 and the second connecting portion 123 of the second lead 802 to each other. The intermediate connection band 823 is sandwiched between the first connection band 821 and the second connection band 822 in the second direction y. The intermediate connection band 823 connects the first connection band 821 and the second connection band 822 to each other.

As shown in FIG. 16, the second tie bar 83 is separated from the first tie bar 82 in the first direction x. The second tie bar 83 has a strip-like shape extending in the second direction y as viewed in the thickness direction z. Both ends of the second tie bar 83 in the second direction y are connected to the first frame portion 811. The first terminal portion 112 of the first lead 801, the second terminal portion 122 of the second lead 802, the third terminal portion 132 of the third lead 13, the fourth terminal portion 142 of the fourth lead 14, and the plurality of fifth leads 15 are all connected to the second tie bar 83 in the second direction y.

In the step shown in FIG. 16, the first switching element 21 is electrically bonded to the first pad portion 111 of the first lead 801. The second switching element 22 is electrically bonded to the second pad portion 121 of the second lead 802. In the semiconductor device A10, a drive IC 30 is mounted on a fourth pad portion 141 of the fourth lead 14. After the first switching element 21 and the second switching element 22 are electrically bonded to the lead frame 80, various wires including a first wire 41 and a second wire 42 are connected to the lead frame 80 and so on by wire bonding.

Next, as shown in FIG. 17, a sealing resin 50 is formed that covers portions of the first lead 801, the second lead 802, the third lead 13, the fourth lead 14, and the plurality of fifth leads 15, as well as the first switching element 21, the second switching element 22, and the drive IC 30. The sealing resin 50 is formed by transfer molding. In this step, first leak portions 50A are formed in opening areas of the lead frame 80, and these areas are sandwiched between a first side surface 531 of the sealing resin 50 and the second tie bar 83 in the first direction x. At the same time, a second leak portion 50B is formed in an opening area of the lead frame 80, and this area is sandwiched between a second side surface 532 of the sealing resin 50 and the intermediate connection band 823 of the first tie bar 82 in the first direction x. The first leak portions 50A and the second leak portion 50B are burrs created when the sealing resin 50 is formed.

Figure 18:
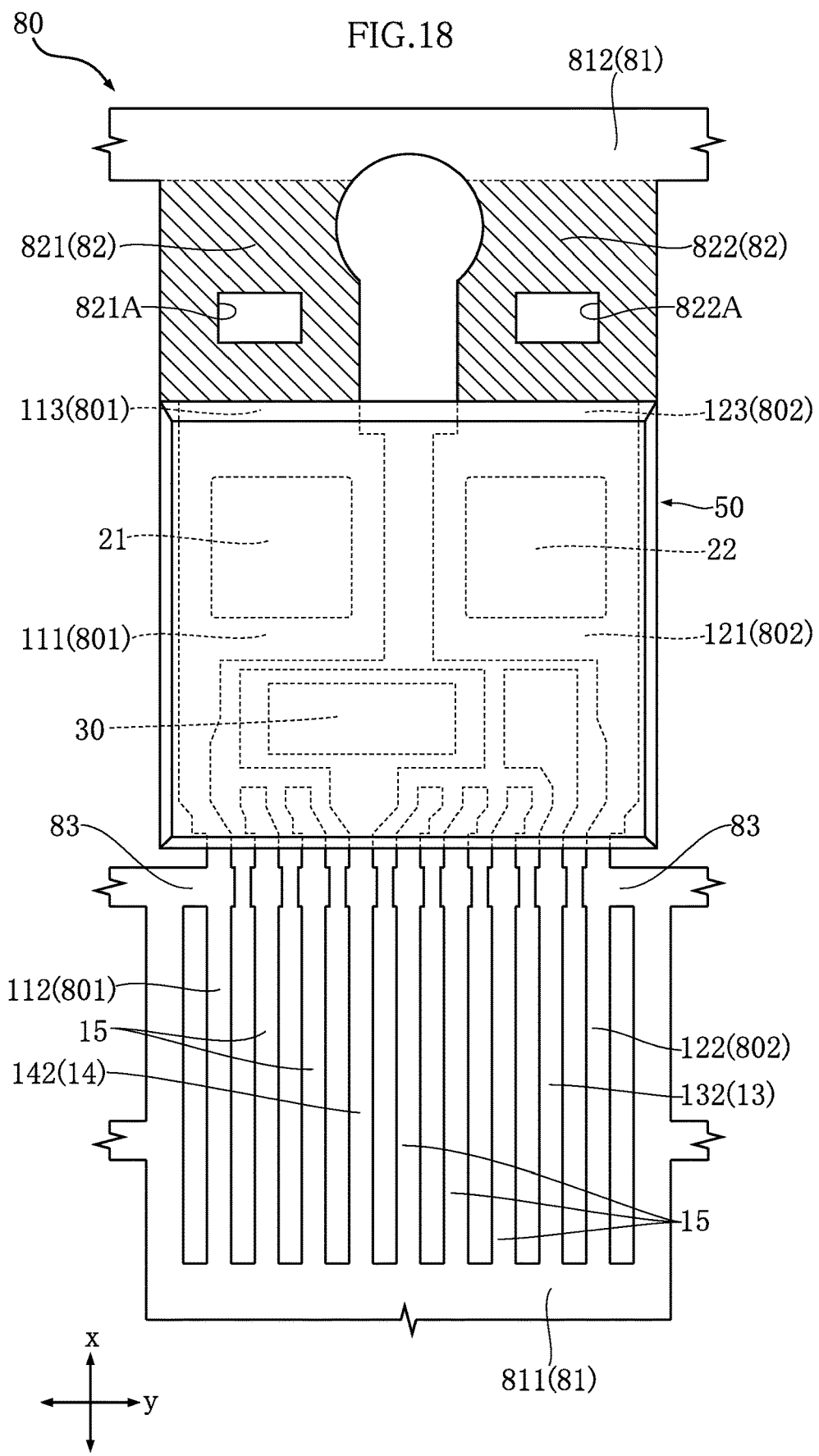
FIG. 18 is a plan view for describing a step of manufacturing the semiconductor device shown in FIG. 1.

Next, as shown in FIG. 18, the intermediate connection band 823 of the first tie bar 82 and portions of the second tie bar 83 are removed by a punching machine or the like. In this step, the plurality of first leak portions 50A and the second leak portion 50B are also removed.

Figure 19:
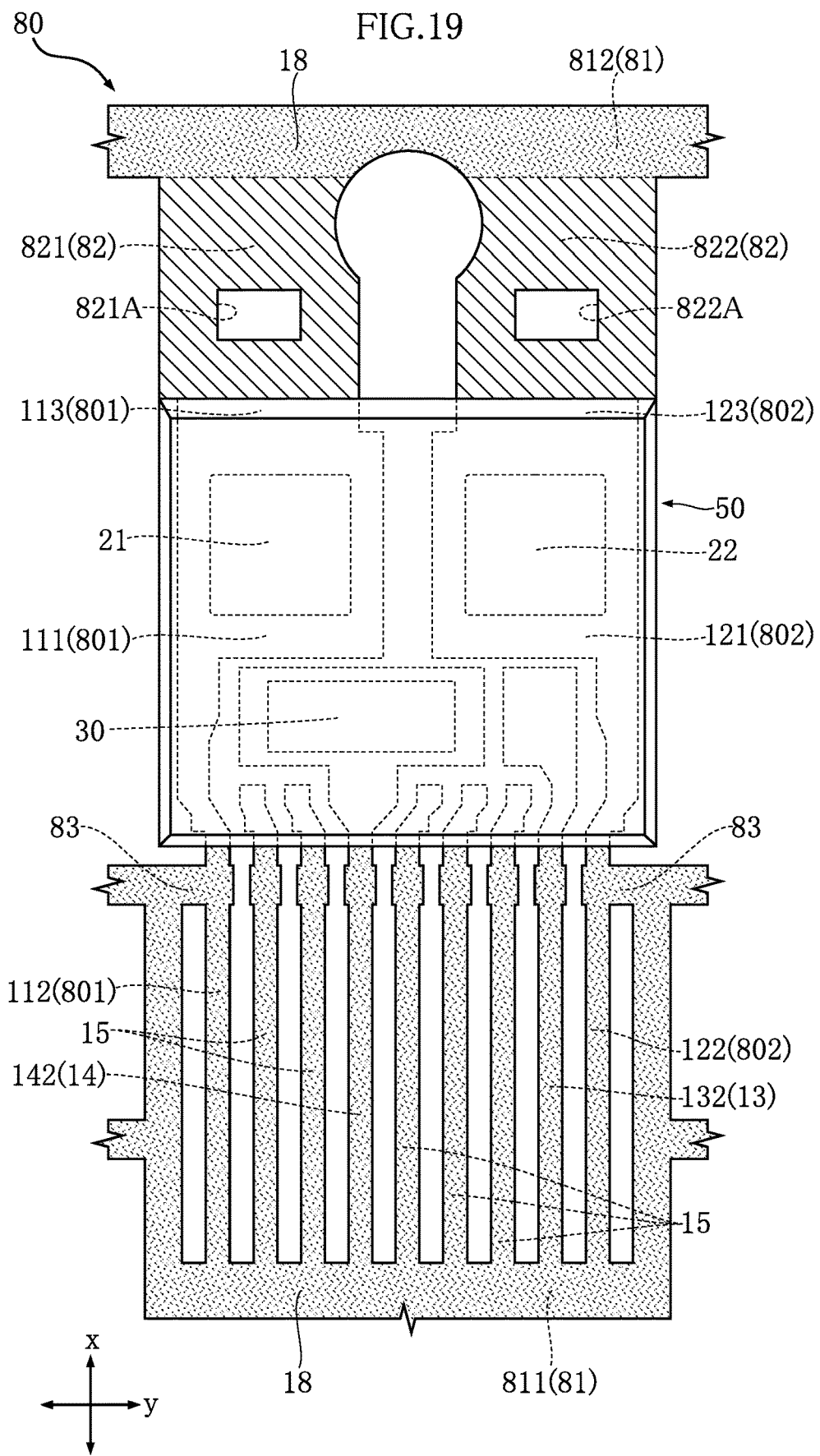
FIG. 19 is a plan view for describing a step of manufacturing the semiconductor device shown in FIG. 1.

Next, as shown in FIG. 19, an outer conductive layer 18 is formed to cover an exposed surface of the lead frame 80, which is a surface exposed from the sealing resin 50. The outer conductive layer 18 is formed by electrolytic plating. Through this step, the surfaces of the first connection band 821 and the second connection band 822 are covered with the outer conductive layer 18. In FIG. 19, the first connection band 821 and the second connection band 822 are indicated by hatching with multiple oblique lines.

Next, as shown in FIG. 20, the first connection band 821 and the second connection band 822 of the first tie bar 82 are cut. The cutting is performed by pressing a blade against the lead frame 80 in the thickness direction z. The first connection band 821 is cut such that, as viewed in the thickness direction z, a cutting line 90 passes through the first through-hole 821A of the first connection band 821 and a pair of areas of the first connection band 821 that sandwich the first through-hole 821A in the second direction y. Similarly, the second connection band 822 is cut such that, as viewed in the thickness direction z, the cutting line 90 passes through a second through-hole 822A of the second connection band 822 and a pair of areas of the second connection band 822 that sandwich the second through-hole 822A in the second direction y. As viewed in the thickness direction z, the cutting line 90, which passes the pair of areas of the first connection band 821 that sandwich the first through-hole 821A, and which also passes the pair of areas of the second connection band 822 that sandwich the second through-hole 822A in the second direction y, are inclined to both the first direction x and the second direction y.

Figure 21:
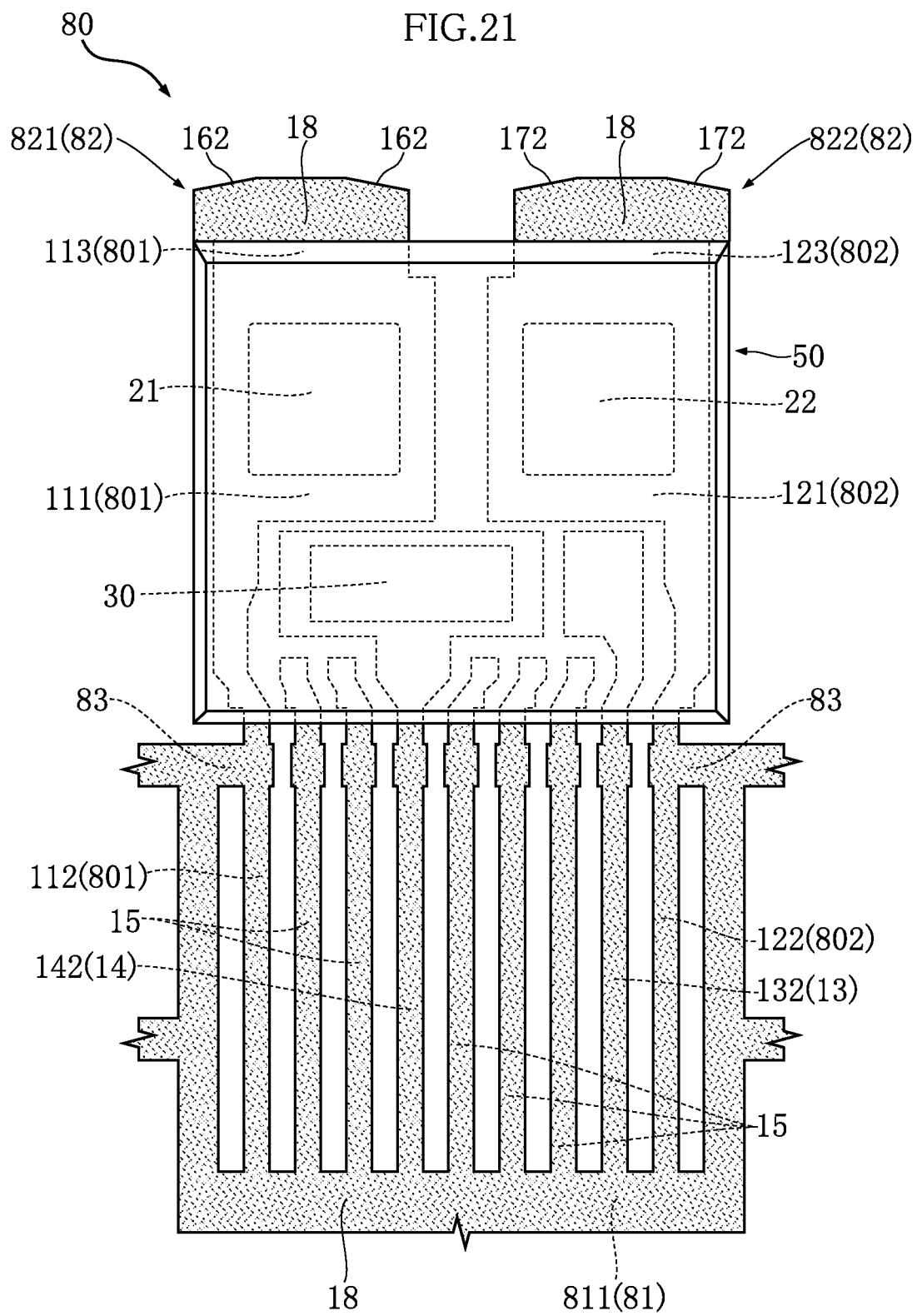
FIG. 21 is a plan view for describing a step of manufacturing the semiconductor device shown in FIG. 1.

FIG. 21 shows the state of the lead frame 80 that has undergone the cutting step of the first connection band 821 and the second connection band 822 in FIG. 20. A portion of the first connection band 821 connected to the first connecting portion 113 of the first lead 801 corresponds to the first block portion 16 of the first lead 11 in the semiconductor device A10. As shown in FIG. 20, the cutting line 90 passes through areas of the first connection band 821 in the thickness direction z, and these areas correspond to the pair of first exposed surfaces 162. A portion of the second connection band 822 connected to the second connecting portion 123 of the second lead 802 corresponds to the second block portion 17 of the second lead 12 in the semiconductor device A10. As shown in FIG. 20, the cutting line 90 passes through areas of the second connection band 822 in the thickness direction z, and these areas correspond to the pair of second exposed surfaces 172.

Figure 22:
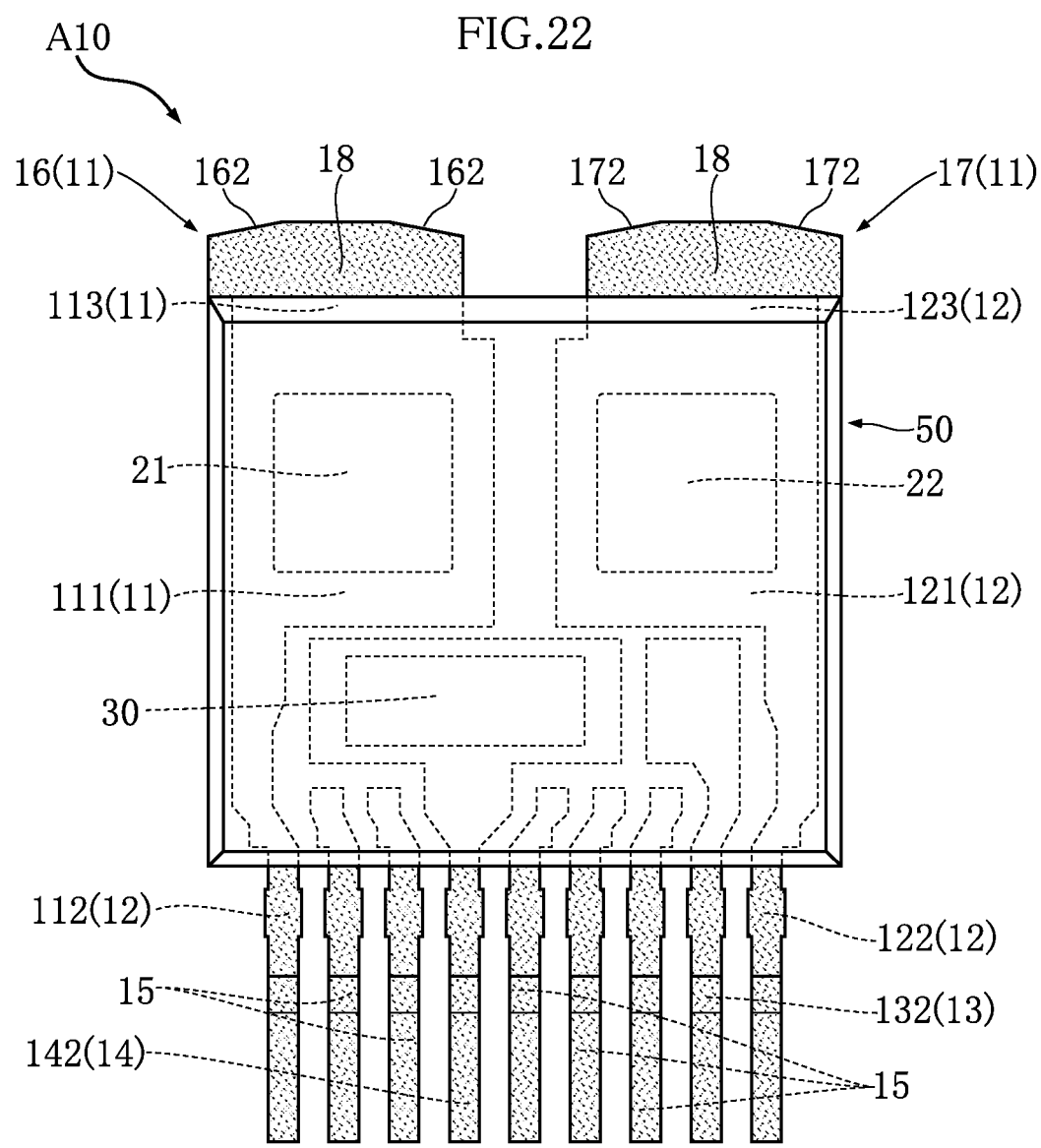
FIG. 22 is a plan view for describing a step of manufacturing the semiconductor device shown in FIG. 1.

Finally, as shown in FIG. 22, the first frame portion 811, and portions of the second tie bar 83, which are connected to the first terminal portion 112 of the first lead 801 and the second terminal portion 122 of the second lead 802, are removed with a punching machine or the like. In this step, exposed portions of the first terminal portion 112, the second terminal portion 122, the third terminal portion 132 of the third lead 13, the fourth terminal portion 142 of the fourth lead 14, and the plurality of fifth leads 15, which are each exposed from the sealing resin 50, are bent in the thickness direction z. Through this step, the exposed portions of the first terminal portion 112, the second terminal portion 122, the third terminal portion 132, the fourth terminal portion 142, and the plurality of fifth leads 15, which are each exposed from the sealing resin 50, are each bent in a hook shape as viewed in the second direction y. The semiconductor device A10 is manufactured through these steps as described above.

Figure 23:
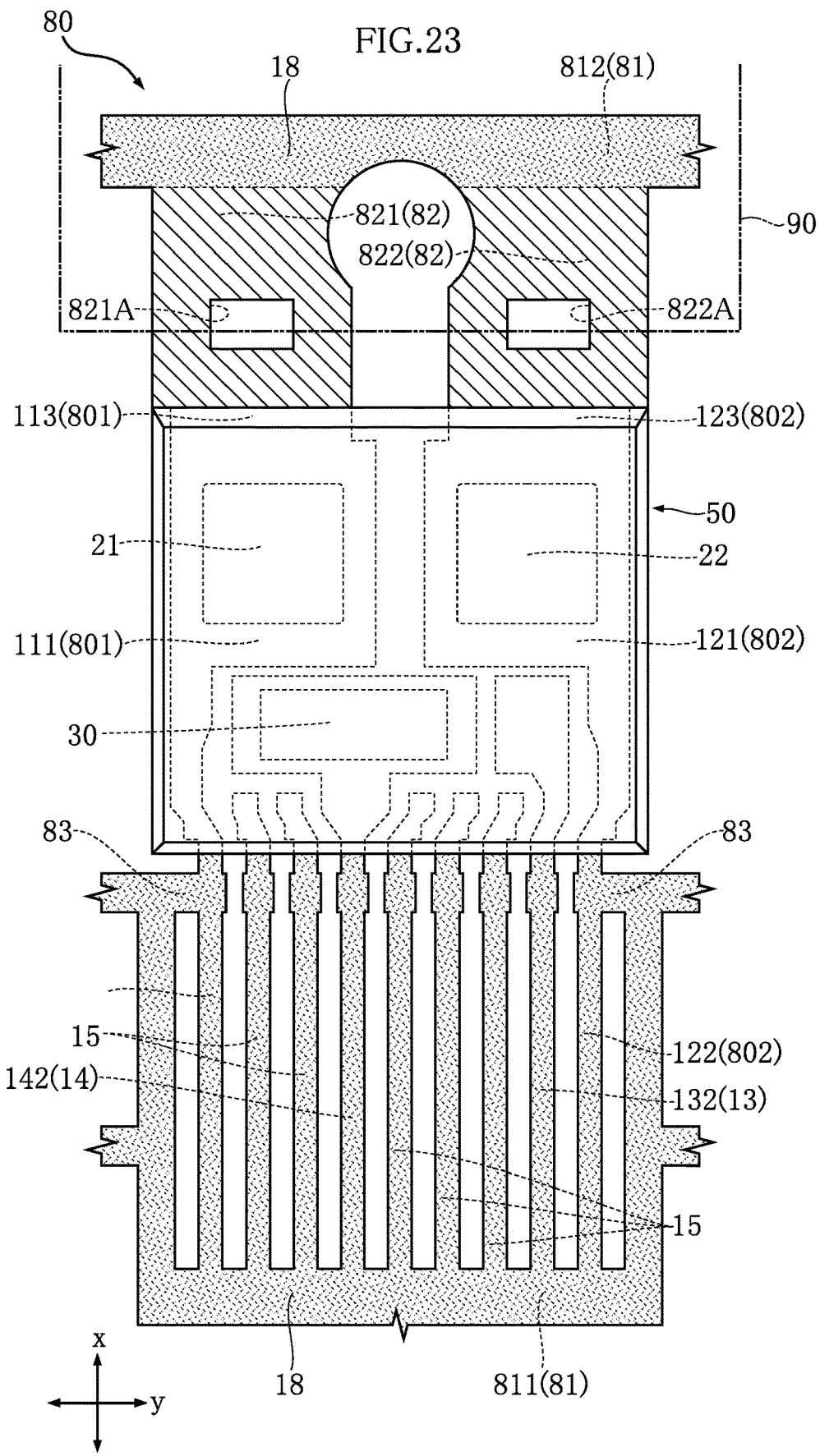
FIG. 23 is a plan view for describing a step of manufacturing the semiconductor device shown in FIG. 13.

FIG. 23 shows a step of cutting both the first connection band 821 and the second connection band 822 of the first tie bar 82 when the semiconductor device A11 is manufactured. In this case, the cutting line 90, which passes the pair of areas of the first connection band 821 that sandwich the first through-hole 821A, and which also passes the pair of areas of the second connection band 822 that sandwich the second through-hole 822A in the second direction y, are parallel to the second direction y as viewed in the thickness direction z.

Figure 24:
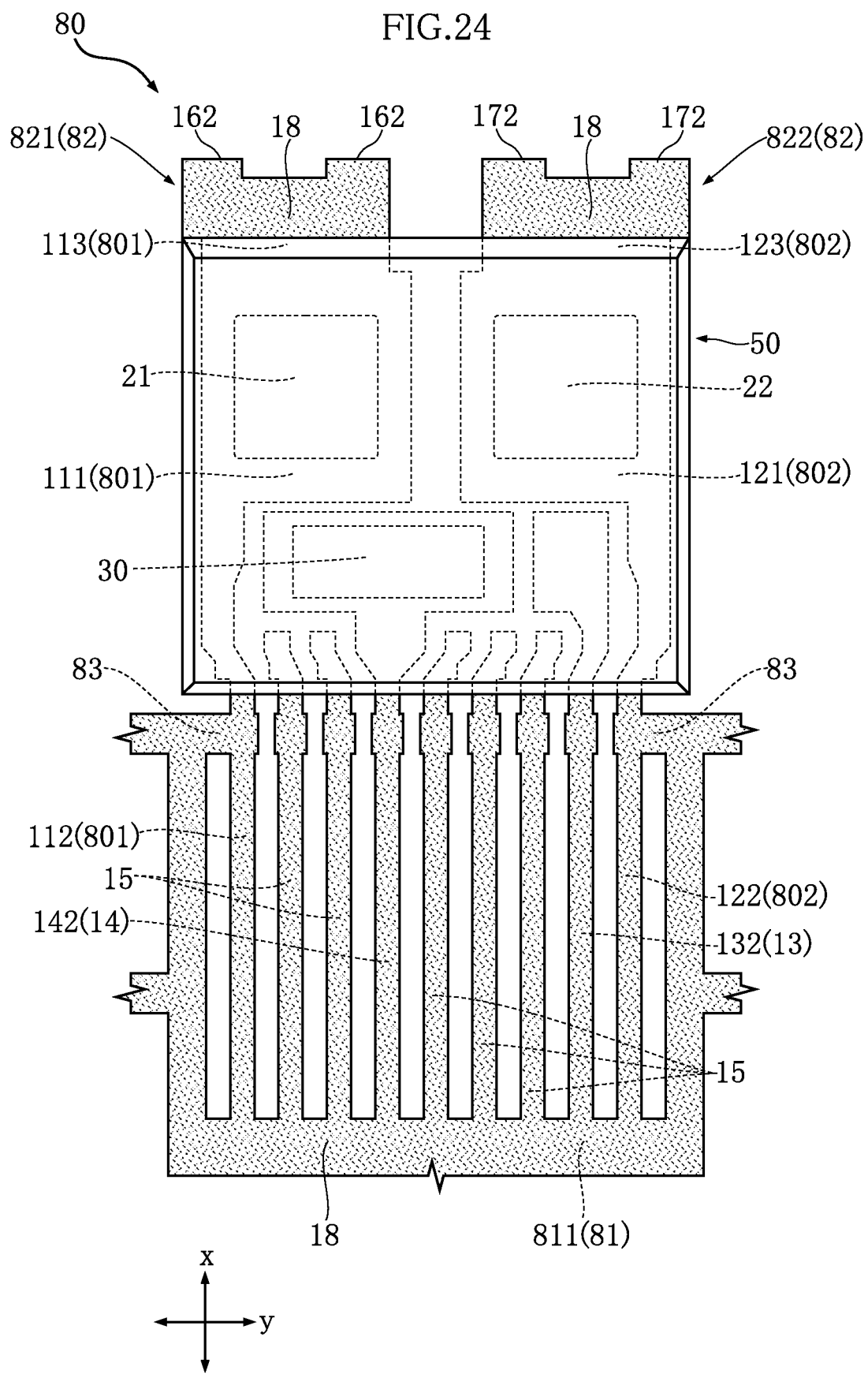
FIG. 24 is a plan view for describing a step of manufacturing the semiconductor device shown in FIG. 13.

FIG. 24 shows the state of the lead frame 80 that has undergone the cutting step of the first connection band 821 and the second connection band 822 in FIG. 23. A portion of the first connection band 821 connected to the first connecting portion 113 of the first lead 801 corresponds to the first block portion 16 of the first lead 11 in the semiconductor device A11. As shown in FIG. 23, the cutting line 90 passes through areas of the first connection band 821 in the thickness direction z, and these areas correspond to the pair of first exposed surfaces 162. A portion of the second connection band 822 connected to the second connecting portion 123 of the second lead 802 corresponds to the second block portion 17 of the second lead 12 in the semiconductor device A11. As shown in FIG. 23, the cutting line 90 passes through areas of the second connection band 822 in the thickness direction z, and these areas correspond to the pair of second exposed surfaces 172.

The following describes advantages of the semiconductor device A10 and the method for manufacturing the semiconductor device A10.

The lead frame 80 used in the method for manufacturing the semiconductor device A10 has the first tie bar 82 as shown in FIG. 17. The first tie bar 82 has the intermediate connection band 823 that connects the first connection band 821 and the second connection band 822 in the second direction y. This reduces the size of the second leak portion 50B created during the formation of the sealing resin 50. The second leak portion 50B is removed together with the intermediate connection band 823 during the step of removing the intermediate connection band 823 as shown in FIG. 18. This facilitates the removal of resin burrs, such as the second leak portion 50B, created during the formation of the sealing resin 50.

In the manufacturing of the semiconductor device A10, the first connection band 821 and the second connection band 822 shown in FIG. 20 are cut after the intermediate connection band 823 and the second leak portion 50B are collectively removed during the step of FIG. 18. The first connection band 821 is cut such that, as viewed in the thickness direction z, the cutting line 90 passes through the first through-hole 821A of the first connection band 821 and the pair of areas of the first connection band 821 that sandwich the first through-hole 821A in the second direction y. The second connection band 822 is cut such that, as viewed in the thickness direction z, the cutting line 90 passes through the second through-hole 822A of the second connection band 822 and the pair of areas of the second connection band 822 that sandwich the second through-hole 822A in the second direction y. This reduces the cutting areas of the first connection band 821 and the second connection band 822, thus facilitating the cutting of these connection bands.

As shown in FIG. 21, the portion of the first connection band 821 connected to the first lead 801, which is obtained as a result of cutting the first connection band 821, corresponds to the first block portion 16 of the semiconductor device A10 shown in FIG. 2. Similarly, as shown in FIG. 21, the portion of the second connection band 822 connected to the second lead 802, which is obtained as a result of cutting the second connection band 822, corresponds to the second block portion 17 of the semiconductor device A10 shown in FIG. 2. The first block portion 16 and the second block portion 17 function as heat dissipators of the semiconductor device A10.

As described above, the method for manufacturing the semiconductor device A10 can reduce the size of resin burrs created during the manufacturing of the semiconductor device A10 while improving the heat dissipation property of the semiconductor device A10.

The semiconductor device A10 includes the first lead 11 having the first block portion 16, and the second lead 12 having the second block portion 17. The first block portion 16 and the second block portion 17 protrude from the second side surface 532 of the sealing resin 50 in the first direction x. The first block portion 16 has the first covered surface 161 covered with the outer conductive layer 18, and the pair of first exposed surfaces 162 from which the base material is exposed. The pair of first exposed surfaces 162 are separated from each other in the second direction y with an area (first area 161A) of the first covered surface 161 sandwiched therebetween. The first block portion 16 having this structure can be created by cutting the first connection band 821 during the manufacturing of the semiconductor device A10, and the pair of first exposed surfaces 162 are cut surfaces of the first connection band 821.

The second block portion 17 has the second covered surface 171 covered with the outer conductive layer 18, and the pair of second exposed surfaces 172 from which the base material is exposed. The pair of second exposed surfaces 172 are separated from each other in the second direction y with an area (third area 171A) of the second covered surface 171 sandwiched therebetween. The second block portion 17 having this structure can be created by cutting the second connection band 822 during the manufacturing of the semiconductor device A10, and the pair of second exposed surfaces 172 are cut surfaces of the second connection band 822. Accordingly, the semiconductor device A10 can reduce the size of resin burrs created during the manufacturing of the semiconductor device A10 while ensuring the heat dissipation property of the semiconductor device A10.

At the first block portion 16 of the semiconductor device A10, the first area 161A of the first covered surface 161 is located farther away from the first pad portion 111 of the first lead 11 than the pair of second areas 161B of the first covered surface 161 in the first direction x. The first exposed surfaces 162 are connected to the first area 161A and inclined to both the first area 161A and the second areas 161B. In this way, even if, during the step of cutting the first connection band 821 in the manufacturing of the semiconductor device A10, the position of a blade deviates from a predetermined position in the first direction x, the cutting line 90 can pass through the first through-hole 821A of the first connection band 821 as viewed in the thickness direction z.

Also, at the second block portion 17 of the semiconductor device A10, the third area 171A of the second covered surface 171 is located farther away from the second pad portion 121 of the second lead 12 than the pair of fourth areas 171B of the second covered surface 171 in the first direction x. The second exposed surfaces 172 are connected to the third area 171A and inclined to both the third area 171A and the fourth areas 171B. In this way, even if, during the step of cutting the second connection band 822 in the manufacturing of the semiconductor device A10, the position of a blade deviates from a predetermined position in the first direction x, the cutting line 90 can pass through the second through-hole 822A of the second connection band 822 as viewed in the thickness direction z.

The semiconductor device A10 includes the drive IC 30 mounted on the fourth pad portion 141 of the fourth lead 14. This allows the semiconductor device A10 to directly drive and control the first switching element 21 and the second switching element 22.

The first reverse surface 111B of the first pad portion 111 (first lead 11) and the second reverse surface 121B of the second pad portion 121 (second lead 12) are exposed from the bottom surface 52 of the sealing resin 50. This improves the heat dissipation properties of the first pad portion 111 and the second pad portion 121.

Figure 25:
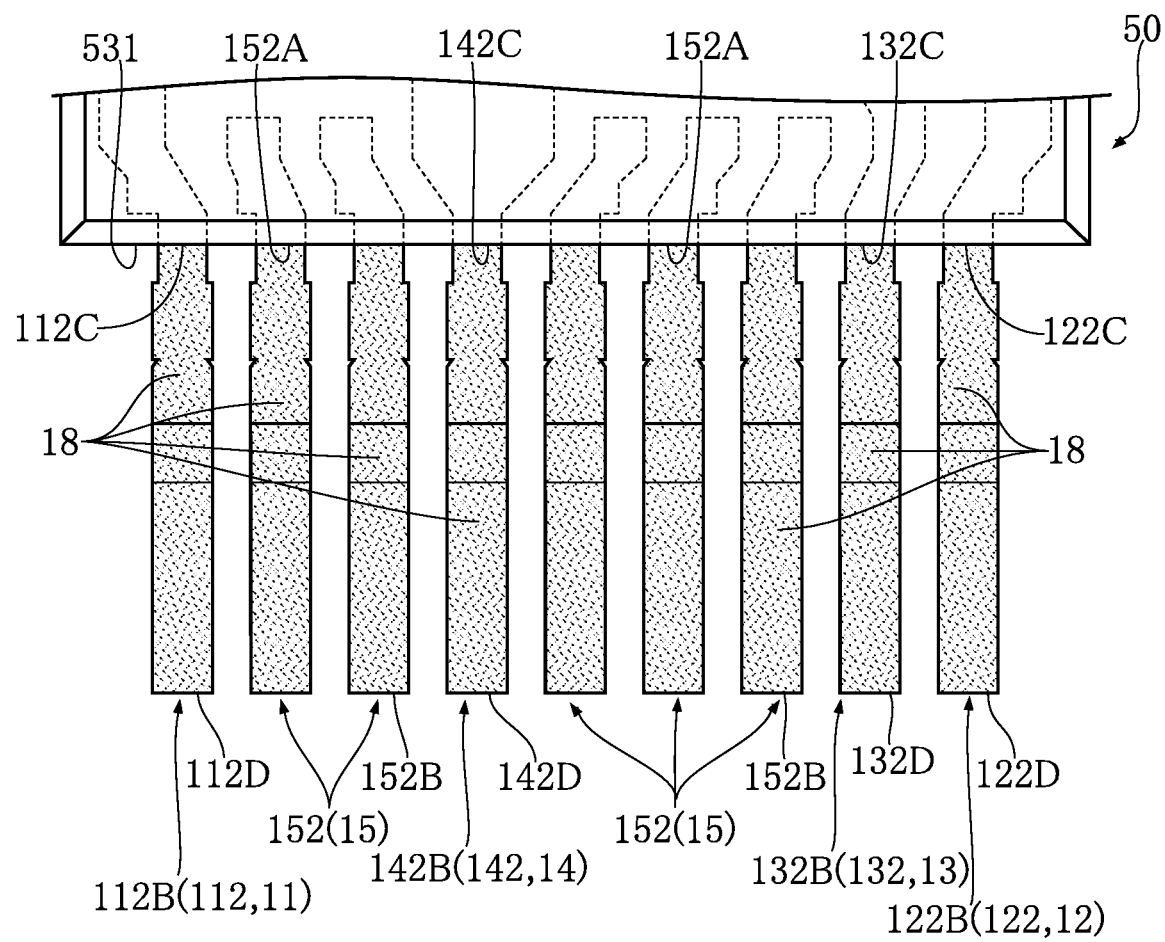
FIG. 25 is a partially enlarged plan view showing a semiconductor device according to a second embodiment of the present disclosure.
Figure 26:
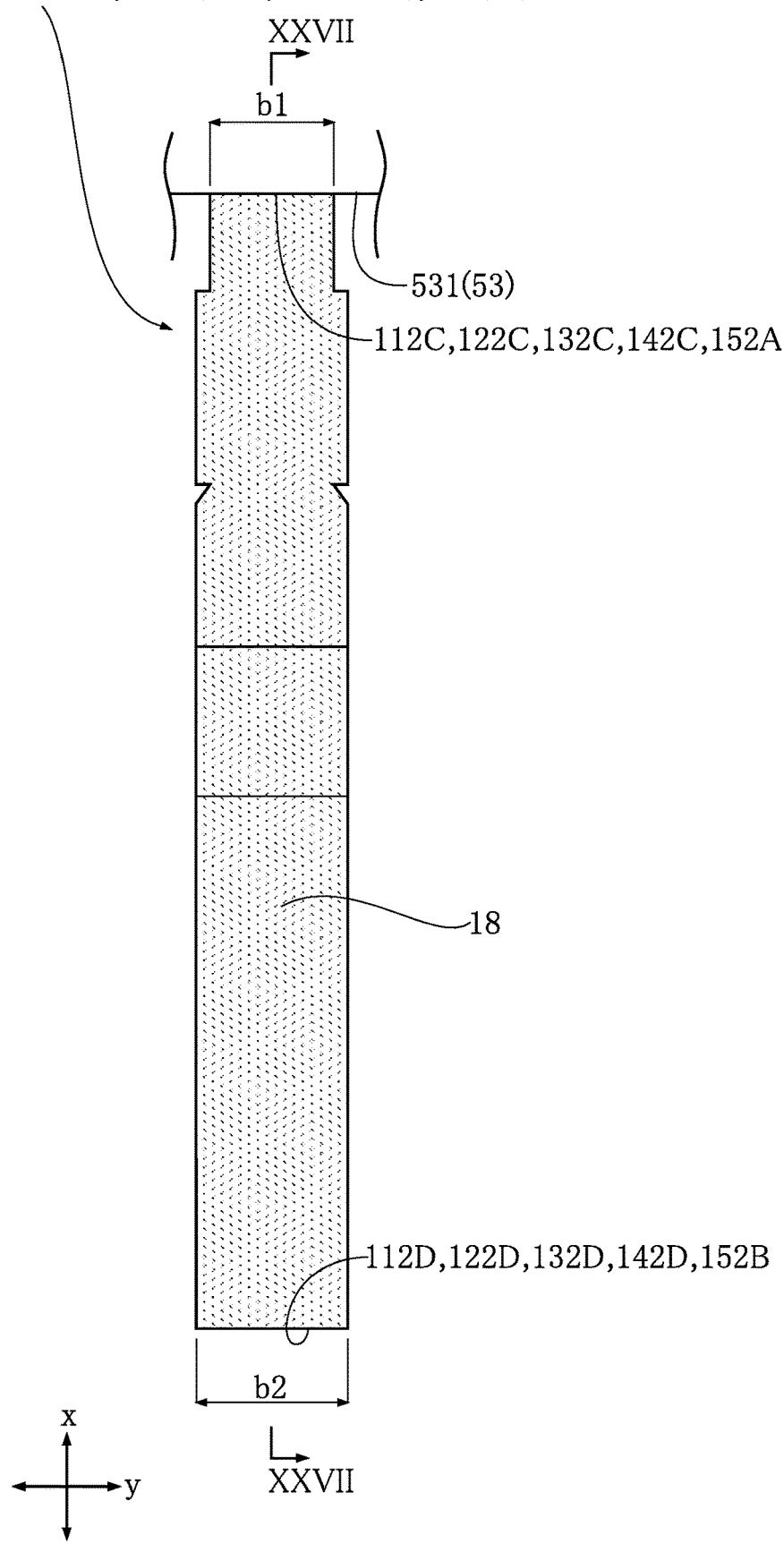
FIG. 26 is a partially enlarged view of FIG. 25.
Figure 27:
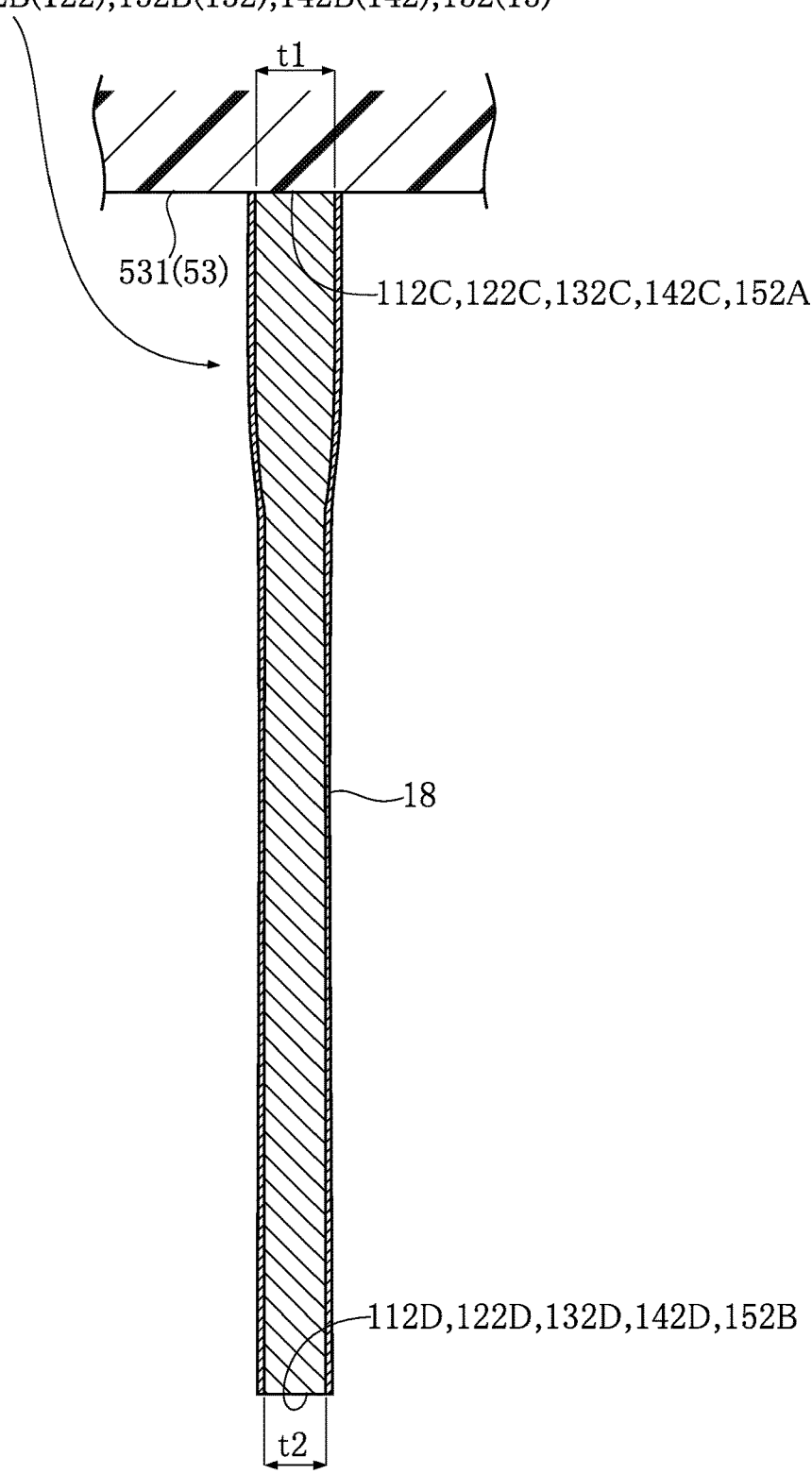
FIG. 27 is a cross-sectional view taken along line XXVII-XXVII in FIG. 26.

With reference to FIGS. 25 to 27, a semiconductor device A20 according to a second embodiment of the present disclosure is described. In these figures, elements that are the same as or similar to those of the semiconductor device A10 described above are provided with the same reference signs, and descriptions thereof are omitted.

The semiconductor device A20 differs from the semiconductor device A10 in the structures of the first terminal portion 112 (first lead 11), the second terminal portion 122 (second lead 12), the third terminal portion 132 (third lead 13), the fourth terminal portion 142 (fourth lead 14), and the plurality of fifth leads 15. The other elements in the semiconductor device A20 have the same structures as those in the semiconductor device A10.

As shown in FIG. 25, the first exposed portion 112B of the first terminal portion 112 has a first boundary 112C and a first tip 112D. The first boundary 112C is an end of the first exposed portion 112B in the first direction x, and is located at the boundary with the first side surface 531 of the sealing resin 50. The first tip 112D is the other end of the first exposed portion 112B in the first direction x. As shown in FIGS. 26 and 27, the width b2 of the first tip 112D is larger than the width b1 of the first boundary 112C. In contrast, the thickness t2 of the first tip 112D is smaller than the thickness t1 of the first boundary 112C.

As shown in FIG. 25, the second exposed portion 122B of the second terminal portion 122 has a second boundary 122C and a second tip 122D. The second boundary 122C is an end of the second exposed portion 122B in the first direction x, and is located at the boundary with the first side surface 531 of the sealing resin 50. The second tip 122D is the other end of the second exposed portion 122B in the first direction x. As shown in FIGS. 26 and 27, the width b2 of the second tip 122D is larger than the width b1 of the second boundary 122C. In contrast, the thickness t2 of the second tip 122D is smaller than the thickness t1 of the second boundary 122C.

As shown in FIG. 25, the third exposed portion 132B of the third terminal portion 132 has a third boundary 132C and a third tip 132D. The third boundary 132C is an end of the third exposed portion 132B in the first direction x, and is located at the boundary with the first side surface 531 of the sealing resin 50. The third tip 132D is the other end of the third exposed portion 132B in the first direction x. As shown in FIGS. 26 and 27, the width b2 of the third tip 132D is larger than the width b1 of the third boundary 132C. In contrast, the thickness t2 of the third tip 132D is smaller than the thickness t1 of the third boundary 132C.

As shown in FIG. 25, the fourth exposed portion 142B of the fourth terminal portion 142 has a fourth boundary 142C and a fourth tip 142D. The fourth boundary 142C is an end of the fourth exposed portion 142B in the first direction x, and is located at the boundary with the first side surface 531 of the sealing resin 50. The fourth tip 142D is the other end of the fourth exposed portion 142B in the first direction x. As shown in FIGS. 26 and 27, the width b2 of the fourth tip 142D is larger than the width b1 of the fourth boundary 142C. In contrast, the thickness t2 of the fourth tip 142D is smaller than the thickness t1 of the fourth boundary 142C.

As shown in FIG. 25, each of the fifth exposed portions 152 of the plurality of fifth leads 15 has a fifth boundary 152A and a fifth tip 152B. The fifth boundary 152A is an end of the fifth exposed portion 152 in the first direction x, and is located at the boundary with the first side surface 531 of the sealing resin 50. The fifth tip 152B is the other end of the fifth exposed portion 152 in the first direction x. As shown in FIGS. 26 and 27, the width b2 of the fifth tip 152B is larger than the width b1 of the fifth boundary 152A. In contrast, the thickness t2 of the fifth tip 152B is smaller than the thickness t1 of the fifth boundary 152A.

Next, with reference to FIGS. 28 to 31, a step in an example of a method for manufacturing the semiconductor device A20, which differs from any of the steps in the example of the method for manufacturing the semiconductor device A10, will be described. In these figures, elements that are the same as or similar to those of the semiconductor device A10 described above are provided with the same reference signs, and descriptions thereof are omitted.

Figure 28:
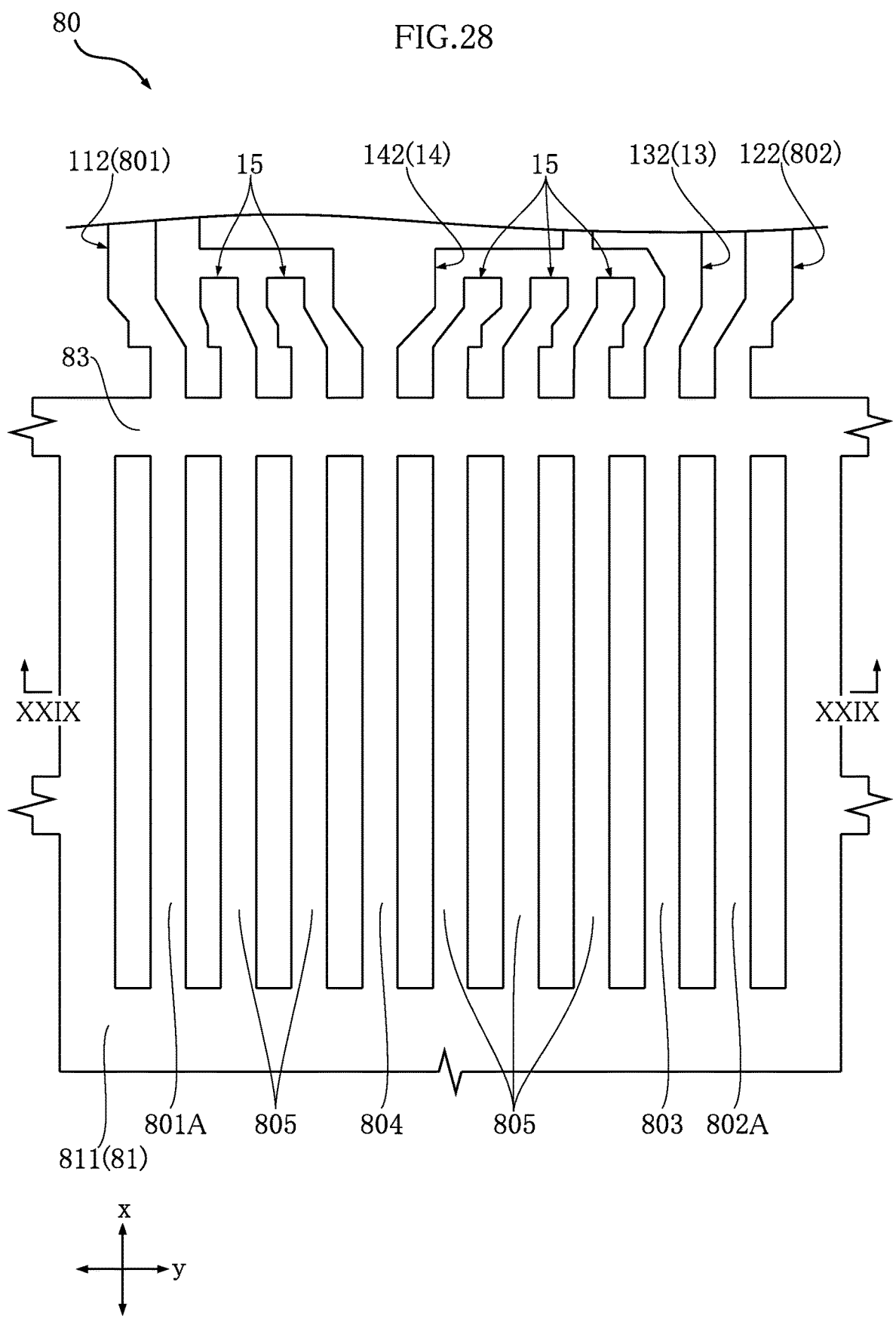
FIG. 28 is a partially enlarged plan view for describing a step of manufacturing the semiconductor device shown in FIG. 25.
Figure 29:
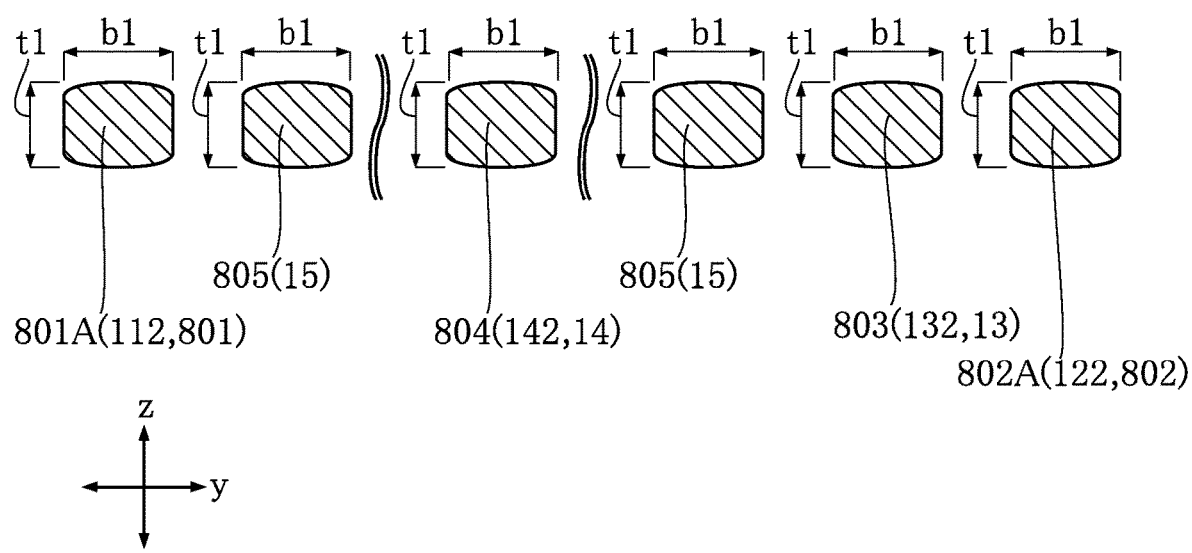
FIG. 29 is a cross-sectional view taken along line XXIX-XXIX in FIG. 28.

FIGS. 28 and 29 show the state of the lead frame 80 before the step (see FIG. 16) of electrically bonding the first switching element 21 and the second switching element 22 to the lead frame 80.

As shown in FIG. 28, the first terminal portion 112 of the first lead 801 has a first strip 801A. The first strip 801A corresponds to a portion of the first exposed portion 112B (first terminal portion 112) of the semiconductor device A20. The first strip 801A is located opposite from the first tie bar 82 with respect to the second tie bar 83 in the first direction x. The first strip 801A has a strip-like shape extending in the first direction x as viewed in the thickness direction z. The respective ends of the first strip 801A in the first direction x are connected to the second tie bar 83 and the first frame portion 811. As shown in FIG. 29, the cross section of the first strip 801A is rectangular with a width b1 and a thickness t1.

As shown in FIG. 28, the second terminal portion 122 of the second lead 802 has a second strip 802A. The second strip 802A corresponds to a portion of the second exposed portion 122B (second terminal portion 122) of the semiconductor device A20. The second strip 802A is located opposite from the first tie bar 82 with respect to the second tie bar 83 in the first direction x. The second strip 802A has a strip-like shape extending in the first direction x as viewed in the thickness direction z. The respective ends of the second strip 802A in the first direction x are connected to the second tie bar 83 and the first frame portion 811. As shown in FIG. 29, the cross section of the second strip 802A is rectangular with a width b1 and a thickness t1.

As shown in FIG. 28, the third terminal portion 132 of the third lead 13 has a third strip 803. The third strip 803 corresponds to a portion of the third exposed portion 132B (third terminal portion 132) of the semiconductor device A20. The third strip 803 is located opposite from the first tie bar 82 with respect to the second tie bar 83 in the first direction x. The third strip 803 has a strip-like shape extending in the first direction x as viewed in the thickness direction z. The respective ends of the third strip 803 in the first direction x are connected to the second tie bar 83 and the first frame portion 811. As shown in FIG. 29, the cross section of the third strip 803 is rectangular with a width b1 and a thickness t1.

As shown in FIG. 28, each of the plurality of fifth leads 15 has a fifth strip 805. The fifth strip 805 corresponds to a portion of the fifth exposed portion 152 (fifth lead 15) of the semiconductor device A20. The fifth strip 805 is located opposite from the first tie bar 82 with respect to the second tie bar 83 in the first direction x. The fifth strip 805 has a strip-like shape extending in the first direction x as viewed in the thickness direction z. The respective ends of the fifth strip 805 in the first direction x are connected to the second tie bar 83 and the first frame portion 811. As shown in FIG. 29, the cross section of the fifth strip 805 is rectangular with a width b1 and a thickness t1.

Figure 30:
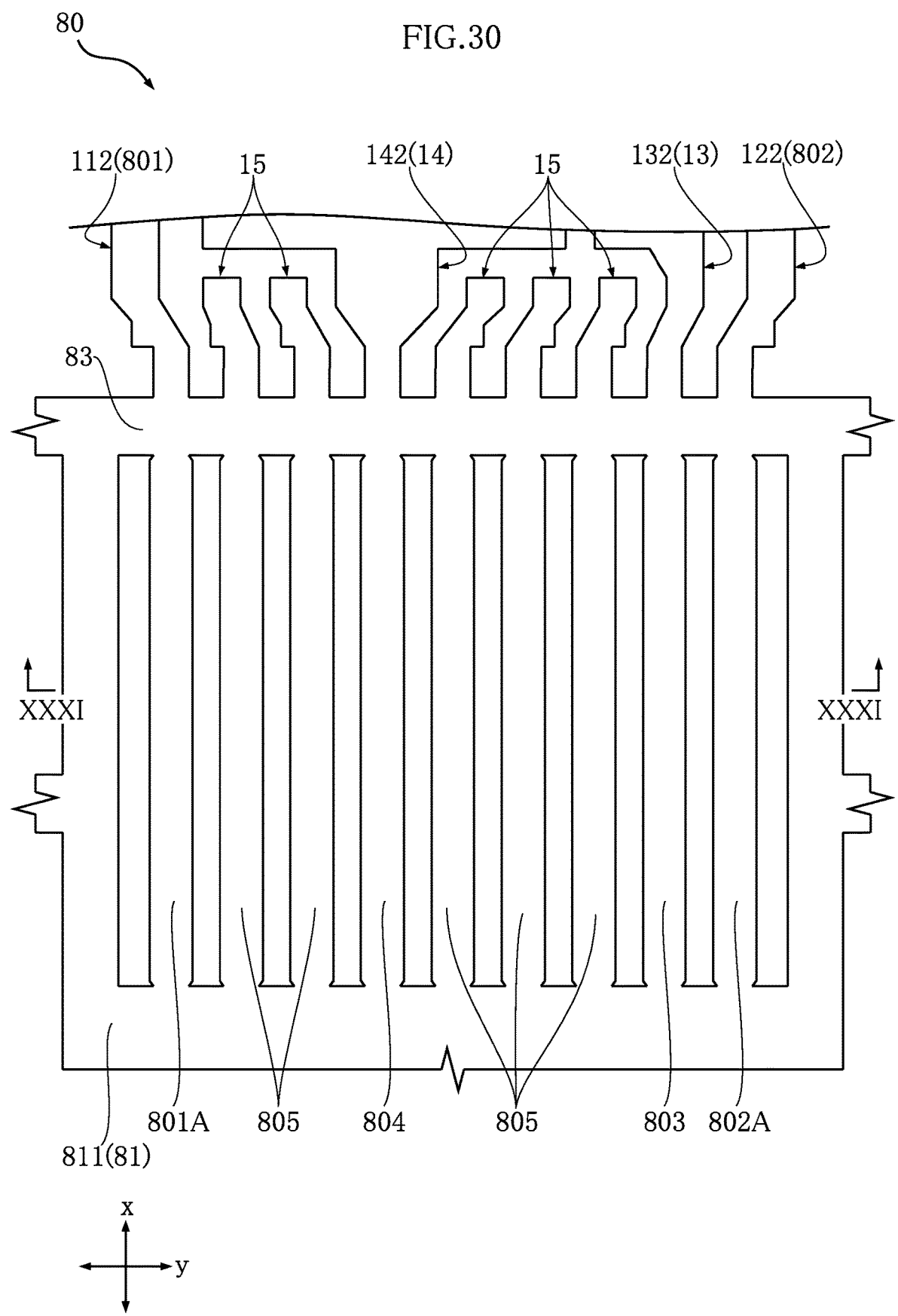
FIG. 30 is a partially enlarged plan view for describing a step of manufacturing the semiconductor device shown in FIG. 25.
Figure 31:
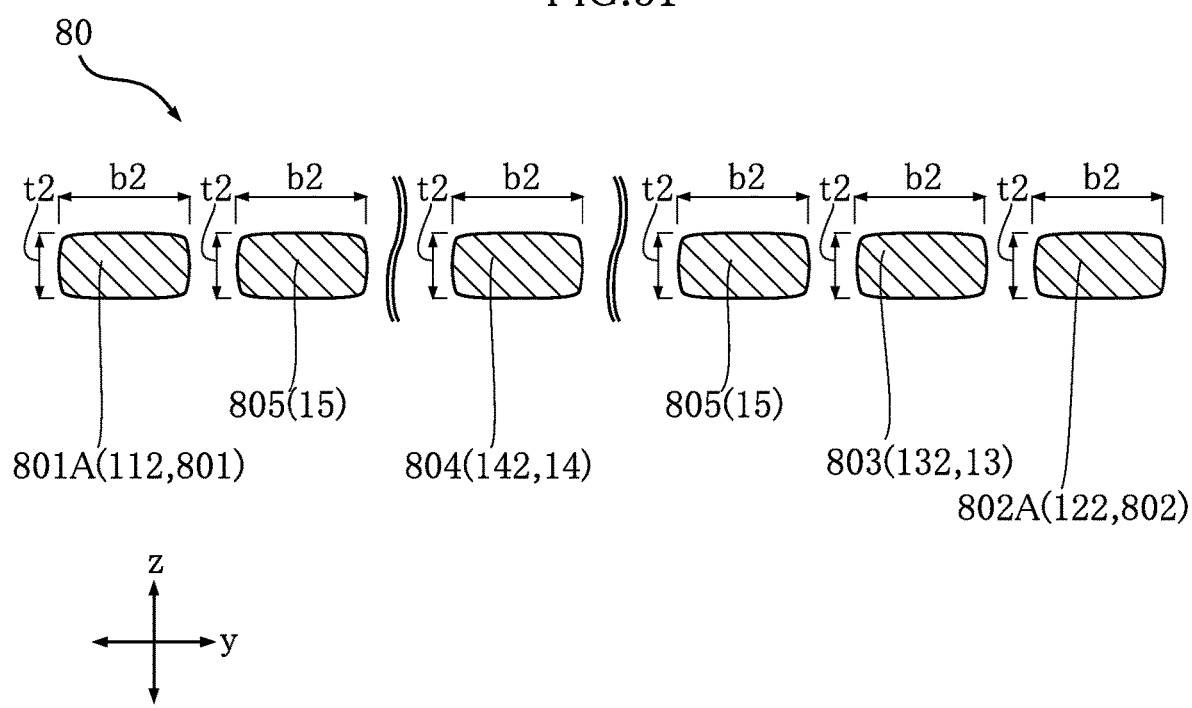
FIG. 31 is a cross-sectional view taken along line XXXI-XXXI in FIG. 30.

As shown in FIGS. 30 and 31, the first strip 801A, the second strip 802A, the third strip 803, a fourth strip 804, and the plurality of fifth strips 805 of the lead frame 80 shown in FIGS. 28 and 29 are pressed in the thickness direction z. Examples of a method for pressing these strips include hitting with a hammer. This step is performed before the step (see FIG. 16) of electrically bonding the first switching element 21 and the second switching element 22 to the lead frame 80. With this step, the first strip 801A, the second strip 802A, the third strip 803, the fourth strip 804, and the plurality of fifth strips 805 are plastically deformed to expand in the first direction x.

The width b2 of each of the first strip 801A, the second strip 802A, the third strip 803, the fourth strip 804, and the plurality of fifth strips 805 is larger than the width b1 of each of these portions shown in FIG. 29. On the other hand, the thickness t2 of each of the first strip 801A, the second strip 802A, the third strip 803, the fourth strip 804, and the plurality of fifth strips 805 is smaller than the thickness t1 of each of these portions shown in FIG. 29.

The remaining steps of manufacturing the semiconductor device A20 after the step of pressing the first strip 801A, the second strip 802A, the third strip 803, the fourth strip 804, and the plurality of fifth strips 805 in the thickness direction z are the same as the corresponding steps of manufacturing the semiconductor device A10 shown in FIGS. 16 to 22.

The following describes advantages of the semiconductor device A20 and the method for manufacturing the semiconductor device A20.

The semiconductor device A20 includes the first lead 11 having the first block portion 16, and the second lead 12 having the second block portion 17. The first block portion 16 of the semiconductor device A20 has the same structure as the first block portion 16 of the semiconductor device A10. The second block portion 17 of the semiconductor device A20 has the same structure as the second block portion 17 of the semiconductor device A10. Accordingly, the semiconductor device A20 can also reduce the size of resin burrs created during the manufacturing of the semiconductor device A20 while ensuring the heat dissipation property of the semiconductor device A20.

The manufacturing process of the semiconductor device A20 includes the step of pressing the first strip 801A and the second strip 802A in the thickness direction z. This step is performed before the step (see FIG. 16) of electrically bonding the first switching element 21 and the second switching element 22 to the lead frame 80. As a result of this step, the first strip 801A and the second strip 802A expand in the first direction x and become flatter in the thickness direction z, as shown in FIGS. 29 and 31. In this way, during the step of bending the first terminal portion 112 (first strip 801A) and the second terminal portion 122 (second strip 802A) in the thickness direction z as shown in FIG. 22, the first strip 801A and the second strip 802A make contact with a bending machine more stably. This makes it possible to reduce twisting of the first terminal portion 112 and the second terminal portion 122 around the first direction x, and to bend the first terminal portion 112 and the second terminal portion 122 such that these portions 112 and 122 are placed more accurately along the first direction x as viewed in the thickness direction z.

Pressing of the first strip 801A in the thickness direction z makes the width b2 of the first tip 112D of the first exposed portion 112B (first terminal portion 112) larger than the width b1 of the first boundary 112C, and makes the thickness t2 of the first tip 112D smaller than the thickness t1 of the first boundary 112C. Pressing of the second strip 802A in the thickness direction z makes the width b2 of the second tip 122D of the second exposed portion 122B (second terminal portion 122) larger than the width b1 of the second tip 122D, and makes the thickness t2 of the second tip 122D smaller than the thickness t1 of the second boundary 122C.

Embodiments of the present disclosure are not limited to the above-described examples. Various design changes can be made to the specific structures of the elements of those examples.

The invention claimed is:

1. A semiconductor device comprising:
a first lead including a first pad portion and a first block portion, the first pad portion having a first obverse surface facing in a thickness direction, the first block portion shifted in position from the first pad portion in a first direction perpendicular to the thickness direction;
a second lead including a second pad portion and a second block portion, the second pad portion having a second obverse surface facing in the thickness direction, the second block portion shifted in position from the second pad portion in the first direction, the second lead being spaced apart from the first lead in a second direction perpendicular to the thickness direction and the first direction;
a first switching element electrically bonded to the first obverse surface and electrically connected to the first lead;
a second switching element electrically bonded to the second obverse surface; and
a sealing resin covering a part of the first lead, a part of the second lead, the first switching element and the second switching element,
wherein the first block portion protrudes from the sealing resin in the first direction, and has a first covered surface and a pair of first exposed surfaces, the first covered surface being covered with an outer conductive layer, the pair of first exposed surfaces being spaced apart from each other in the second direction via a first area of the first covered surface, and
wherein the second block portion protrudes from the sealing resin in the first direction, and has a second covered surface and a pair of second exposed surfaces, the second covered surface being covered with an outer conductive layer, the pair of second exposed surfaces being spaced apart from each other in the second direction via with an area of the second covered surface.

2. The semiconductor device according to claim 1,
wherein the first covered surface includes a first area and a pair of second areas, the first area being sandwiched between the pair of first exposed surfaces, and
wherein the first area and the pair of first exposed surfaces are located between the pair of second areas in the second direction.

3. The semiconductor device according to claim 2,
wherein the first area is located farther away from the first pad portion than is the pair of second areas in the first direction, and
wherein the pair of first exposed surfaces are directly connected to the first area, and are inclined relative to the first area and the pair of second areas.

4. The semiconductor device according to claim 2,
wherein the second covered surface includes a third area and a pair of fourth areas, the third area being sandwiched between the pair of second exposed surfaces, and
wherein the third area and the pair of second exposed surfaces are located between the pair of fourth areas in the second direction.

5. The semiconductor device according to claim 4,
wherein the third area is located farther away from the second pad portion than is the pair of fourth areas in the first direction, and
wherein the second exposed surfaces are directly connected to the third area, and are inclined relative to the third area and the pair of fourth areas.

6. The semiconductor device according to claim 1, wherein the outer conductive layers comprise tin.

7. The semiconductor device according to claim 1, wherein the first lead includes a first terminal portion located opposite from the first block portion with respect to the first pad portion in the first direction,
the second lead includes a second terminal portion located opposite from the second block portion with respect to the second pad portion in the first direction,
the first terminal portion includes a first exposed portion protruding from the sealing resin, and the second terminal portion includes a second exposed portion protruding from the sealing resin.

8. The semiconductor device according to claim 7, further comprising a third lead disposed between the first terminal portion and the second terminal portion as viewed in the thickness direction, wherein the third lead is electrically connected to the second switching element,
the third lead includes a third pad portion and a third terminal portion, the third pad portion facing the second pad portion as viewed in the thickness direction, the third terminal portion being located opposite from the second pad portion with respect to the third pad portion in the first direction, and
the third terminal portion includes a portion protruding from the sealing resin in the first direction.

9. The semiconductor device according to claim 8, wherein the first lead includes a first connecting portion connecting the first pad portion and the first block portion to each other, and the second lead includes a second connecting portion connecting the second pad portion and the second block portion to each other,
each of the first connecting portion and the second connecting portion includes a part covered with the sealing resin.

10. The semiconductor device according to claim 9, further comprising a first wire, wherein the first switching element has a first element obverse surface provided with a first obverse surface electrode,
the first wire is connected to the first obverse surface electrode and the second connecting portion.

11. The semiconductor device according to claim 10, further comprising a second wire, wherein the second switching element has a second element obverse surface provided with a second obverse surface electrode,
the second wire is connected to the second obverse surface electrode and the third pad portion.

12. The semiconductor device according to claim 11, further comprising a fourth lead and a drive IC, wherein the fourth lead is disposed between the first terminal portion and the third lead as viewed in the thickness direction, the fourth lead including a fourth pad portion facing the first pad portion and the second pad portion,
the drive IC is mounted on the fourth pad portion,
the first switching element comprises a first gate electrode provided on the first element obverse surface, and the second switching element comprises a second gate electrode provided on the second element obverse surface,
the drive IC is electrically connected to the first gate electrode and the second gate electrode.

13. The semiconductor device according to claim 12, wherein the fourth pad portion and the drive IC are covered with the sealing resin.

14. The semiconductor device according to claim 13, wherein the fourth lead includes a fourth terminal portion located opposite from the first pad portion and the second pad portion with respect to the fourth pad portion in the first direction, and
the fourth terminal portion includes a part protruding from the sealing resin.

15. The semiconductor device according to claim 14, wherein the fourth terminal portion is electrically connected to the drive IC.

16. The semiconductor device according to claim 14, further comprising fifth leads disposed between the first terminal portion and the second terminal portion in the second direction,
wherein each of the fifth leads includes a part protruding from the sealing resin in the first direction, and each of the fifth leads is electrically connected to the drive IC.

17. The semiconductor device according to claim 7, wherein the first pad portion has a first reverse surface opposite to the first obverse surface,
the second pad portion has a second reverse surface opposite to the second obverse surface, and
the first reverse surface and the second reverse surface are exposed from the sealing resin.

18. The semiconductor device according to claim 7, wherein the first exposed portion has a first boundary and a first tip, the first boundary being located at a boundary with the sealing resin, the first tip being opposite to the first boundary,
the second exposed portion has a second boundary and a second tip, the second boundary being located at a boundary with the sealing resin, the second tip being opposite to the second boundary,
the first tip and the second tip are larger in width than the first boundary and the second boundary, respectively, and
the first tip and the second tip are smaller in thickness than the first boundary and the second boundary, respectively.

19. A method for manufacturing a semiconductor device by using a lead frame including: an outer frame portion; a first tie bar protruding from a part of the outer frame portion in a first direction perpendicular to a thickness direction of the outer frame portion; a first lead; and a second lead, wherein the first tie bar includes a first connection band, a second connection band, and an intermediate connection band, the first connection band and the second connection band being spaced apart from each other in a second direction perpendicular to the thickness direction and the first direction, the intermediate connection band being disposed between the first connection band and the second connection band, and wherein the first lead has an end in the first direction that is connected to the first connection band, and the second lead has an end in the first direction that is connected to the second connection band,
the method comprising:
electrically bonding a first switching element and a second switching element to the first lead and the second lead, respectively;
forming a sealing resin to cover a part of the first lead, a part of the second lead, the first switching element and the second switching element;

removing the intermediate connection band;

forming an outer conductive layer to cover a surface of the lead frame that is exposed from the sealing resin; and cutting the first connection band and the second connection band along a cutting line, wherein the first connection band is formed with a first through-hole extending in the thickness direction, and the second connection band is formed with a second through-hole extending in the thickness direction, the cutting line passes, as viewed in the thickness direction, through the first through-hole, a pair of areas of the first connection band sandwiching the first through-hole in the second direction, the second through-hole, and a pair of areas of the second connection band sandwiching the second through-hole in the second direction.

20. The method according to claim 19, wherein the lead frame further includes a second tie bar spaced apart from the first tie bar in the first direction and elongated in the second direction, the first lead has a first strip located opposite from the first tie bar with respect to the second tie bar in the first direction, the first strip extending in the first direction and connected to the second tie bar and the outer frame portion, and the second lead has a second strip located opposite from the first tie bar with respect to the second tie bar in the first direction, the second strip extending in the first direction and connected to the second tie bar and the outer frame portion, the method further comprising:

pressing the first strip and the second strip in the thickness direction before the bonding of the first switching element and the second switching element to the first lead and the second lead; and bending the first strip and the second strip in the thickness direction after the cutting of the first connection band and the second connection band.

\* \* \* \* \*